United States Patent
Piesciorovsky et al.

(10) Patent No.: US 12,298,357 B2
(45) Date of Patent: May 13, 2025

(54) PHASE TO GROUND FAULT APPARENT ADMITTANCE METHOD WITH PHASE/GROUND BOUNDARIES FOR DETECTING FAULT TYPES

(71) Applicant: UT-Battelle, LLC, Oak Ridge, TN (US)

(72) Inventors: Emilio Charles Piesciorovsky, Oak Ridge, TN (US); Raymond Charles Borges Hink, Knoxville, TN (US); Aaron William Werth, Knoxville, TN (US); Gary Hahn, Loudon, TN (US); Maximiliano Flavio Ferrari Maglia, Knoxville, TN (US); Marissa Enid Morales Rodriguez, West Palm Beach, FL (US)

(73) Assignee: UT-Battelle, LLC, Oak Ridge, TN (US)

( * ) Notice: Subject to any disclaimer, the term of this patent is extended or adjusted under 35 U.S.C. 154(b) by 47 days.

(21) Appl. No.: 18/375,147

(22) Filed: Sep. 29, 2023

(65) Prior Publication Data
US 2024/0210491 A1 Jun. 27, 2024

Related U.S. Application Data

(60) Provisional application No. 63/434,227, filed on Dec. 21, 2022.

(51) Int. Cl.
*G01R 31/52* (2020.01)
*G01R 31/08* (2020.01)
(52) U.S. Cl.
CPC ........... *G01R 31/52* (2020.01); *G01R 31/086* (2013.01); *G01R 31/088* (2013.01)

(58) Field of Classification Search
USPC ........................................................ 324/509
See application file for complete search history.

(56) References Cited

U.S. PATENT DOCUMENTS

| | | | |
|---|---|---|---|
| 5,325,061 A | | 6/1994 | Schweitzer, III |
| 5,515,227 A | * | 5/1996 | Roberts .................. H02H 3/343 361/78 |
| 2022/0200332 A1 | | 6/2022 | Piesciorovsky et al. |

OTHER PUBLICATIONS

Biswas, S.S., et al., "A Real-Time Data-Driven Algorithm for Health Diagnosis and Prognosis of a Circuit Breaker Trip Assembly", IEEE Transactions on Industrial Electronics, Jun. 2015, pp. 3822-3831, vol. 62, No. 6.

(Continued)

*Primary Examiner* — Farhana A Hoque
(74) *Attorney, Agent, or Firm* — Scully, Scott, Murphy & Presser, P.C.

(57) ABSTRACT

A phase to ground fault apparent (PGFA) admittance system and method with phase/ground boundaries for detecting electrical power line faults. The PGFA admittance method with phase/ground boundaries is based on measuring the A, B and C phase admittance magnitudes for faulted and non-faulted phases, resulting in greater than zero and near zero, respectively, and using the phase/ground boundaries to distinguish between the LL and LLG electrical faults. The PGFA admittance method with phase/ground boundaries is based on a pre-setting of values by using the zero, positive and negative sequences of power line sections, to determine phase and ground boundaries. The PGFA admittance algorithm with phase/ground boundaries was built with MATLAB/Simulink software and tested and evaluated with a confusion matrix. The measured and predicted values matched in more than 90% of the tests, and the PGFA admittance method presented an accuracy of 94.3% and a precision of 100%.

25 Claims, 21 Drawing Sheets

(56) References Cited

OTHER PUBLICATIONS

Liu, P., et al., "Detecting Single-Phase-to-Ground Fault Event and Identifying Faulty Feeder in Neutral Ineffectively Grounded Distribution System", IEEE Transactions on Power Delivery, Oct. 2018, pp. 2265-2273.

Piesciorovsky, E.C., et al., "Protection schemes used in North American microgrids", Int. Trans. Electr. Energy Syst. 2020, Revised Mar. 16, 2020, Accepted Apr. 22, 2020, pp. 1-28, 30:e12461.

Piesciorovsky, E.C., et al., "Modeling the impact of GIC neutral blocking devices on distance protection relay operations for transmission lines", Electric Power Systems Research (2020), Accepted Nov. 28, 2019, Available online Dec. 9, 2019, pp. 1-11, vol. 180, 106135.

Piesciorovsky, E.C., et al., "Comparison of High-Speed Adaptive and Non-Adaptive Backup Overcurrent Protection on Fuse Feeders with Sensors", Int. Trans. Electr. Energy Syst. 2019, Revised3 Oct. 19, 2018, Accepted Dec. 6, 2018, pp. 1-17, 29:e2812.

Piesciorovsky, E.C., et al., "Comparison of Programmable Logic and Setting Group Methods for Adaptive Overcurrent Protection in Microgrids", Electric Power Systems Research (2017), Accepted May 27, 2017, Available online Jun. 10, 2017, pp. 273-282.

\* cited by examiner

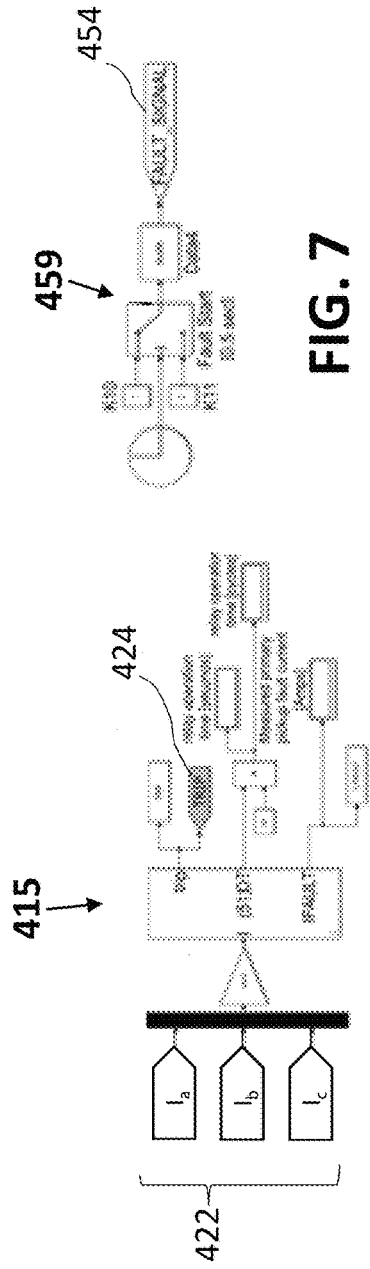

| Mode | Electrical fault locations | Type of tests (states) | N° tests (N° states) | Sensors |
|---|---|---|---|---|
| Grid simulation | Near breaker (fault 409A) | AG, BG, CG, AB, BC, AC, ABG, BCG, ACG, ABC and ABCG electrical faults (pre-fault, fault, and post-fault states) | 33 (99) | Saturated CTs / VTs MATLAB/ Simulink models |
| | Power line section 28 (fault 409B) | AG, BG, CG, AB, BC, AC, ABG, BCG, ACG, ABC and ABCG electrical faults (pre-fault, fault, and post-fault states) | | |
| | Power line section 38 (fault 409C) | AG, BG, CG, AB, BC, AC, ABG, BCG, ACG, ABC and ABCG electrical faults (pre-fault, fault, and post-fault states) | | |

| 1- Calculation of the total resistance and reactance from the power line section 28 to 38 | | | | 2- Calculation of the total admittances | | 3- Calculation of the boundaries | |
|---|---|---|---|---|---|---|---|
| Positive sequence resistance and reactance (Eq. 14) | | Total resistance (Eq. 5) and reactance (Eq. 6) | | Total admittance magnitude (Eq. 7) | | Phase faulted zone boundary (Eq. 9) | |
| $R_{T1}$ | $X_{T1}$ | $R_T = 2\,R_{T1} + R_{T0}$ | $X_T = 2\,X_{T1} + X_{T0}$ | $|Y_T|$ | | $|Y_{pg}| > |Y_T|$ | |
| 0.3044 Ω | 0.3900 Ω | 1.1518 Ω | 1.9904 Ω | 0.435 S | | $|Y_{pg}| > 0.435$ S | |
| Zero sequence resistance and reactance (Eq. 15) | | | | Total zero sequence admittance magnitude (Eq. 8) | | Ground faulted zone boundary (Eq. 10) | |
| $R_{T0}$ | $X_{T0}$ | | | $|Y_{T0}|$ | | $|Y_{pg}| > |Y_{T0}|$ | |
| 0.5430 Ω | 1.2104 Ω | | | 0.754 S | | $|Y_{pg}| > 0.754$ S | |

FIG. 9

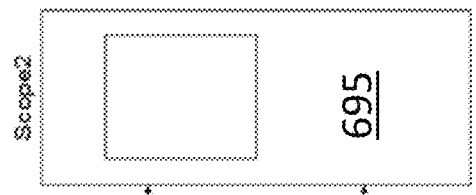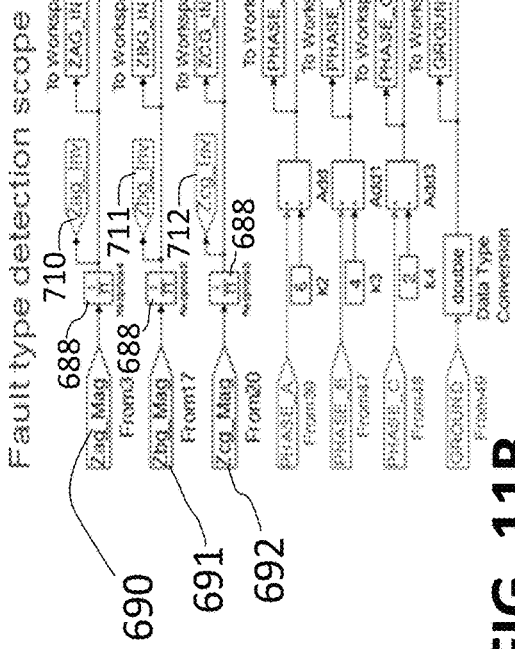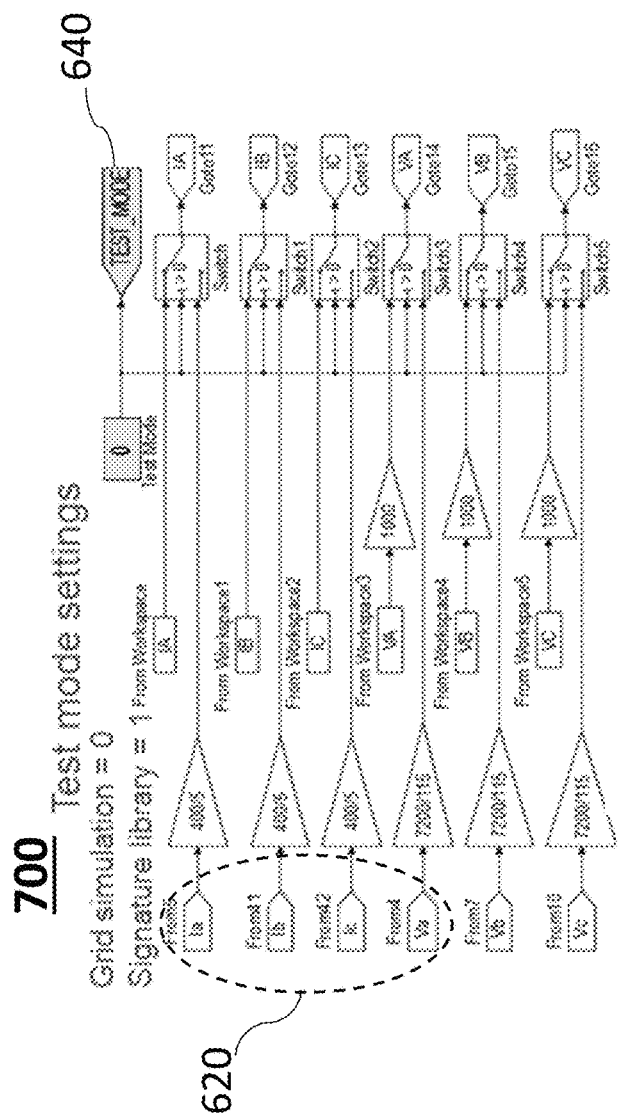
FIG. 11A
FIG. 11B

PGFA admittance and impedance magnitudes

| Test names: Test mode-fault location-type of fault | Groups | Phase A siemens (ohms) | Phase B siemens (ohms) | Phase C siemens (ohms) | FIG. 13 |
|---|---|---|---|---|---|
| GRID-SIMULATION-BREAKER-AG-FAULT | LG-BK | 674.7 (0.0015) | | | × |
| GRID-SIMULATION-BREAKER-BG-FAULT | | | 675.2 (0.0015) | | |
| GRID-SIMULATION-BREAKER-CG-FAULT | | | | 675.2 (0.0015) | |
| GRID-SIMULATION-BREAKER-ABG-FAULT | LLG-BK | 810.2 (0.0012) | 670.1 (0.0015) | 670.5 (0.0015) | □ |
| GRID-SIMULATION-BREAKER-BCG-FAULT | | | 811.5 (0.0012) | 811.9 (0.0012) | |
| GRID-SIMULATION-BREAKER-ACG-FAULT | | 670.4 (0.0015) | | | |
| GRID-SIMULATION-BREAKER-AB-FAULT | LL-BK | 0.7125 (1.4035) | 0.7046 (1.4192) | 0.7083 (1.4178) | ◇ |
| GRID-SIMULATION-BREAKER-BC-FAULT | | | 0.713 (1.4025) | 0.7125 (1.4035) | |
| GRID-SIMULATION-BREAKER-AC-FAULT | 3LG-BK | 0.7046 (1.4192) | 786.9 (0.0013) | 786.9 (0.0013) | ○ |
| GRID-SIMULATION-BREAKER-ABCG-FAULT | 3L-BK | 786.9 (0.0013) | 786.9 (0.0013) | 786.9 (0.0013) | |
| GRID-SIMULATION-BREAKER-ABC-FAULT | | 786.9 (0.0013) | | | |

FIG. 12A

PGFA admittance and impedance magnitudes

| Test names:<br>Test mode-fault location-type of fault | Groups | Phase A<br>siemens<br>(ohms) | Phase B<br>siemens<br>(ohms) | Phase C<br>siemens<br>(ohms) | FIG. 13 |
|---|---|---|---|---|---|
| GRID-SIMULATION-SECTION-28-AG-FAULT | LG-28 | 22.91 (0.0436) | | | ✕ |
| GRID-SIMULATION-SECTION-28-BG-FAULT | LG-28 | | 22.93 (0.0436) | | ✕ |
| GRID-SIMULATION-SECTION-28-CG-FAULT | LG-28 | | | 22.93 (0.0436) | ✕ |
| GRID-SIMULATION-SECTION-28-ABG-FAULT | LLG-28 | 21.48 (0.0466) | 22.26 (0.0449) | | □ |
| GRID-SIMULATION-SECTION-28-BCG-FAULT | LLG-28 | | 21.54 (0.0464) | 22.28 (0.0449) | □ |
| GRID-SIMULATION-SECTION-28-ACG-FAULT | LLG-28 | 22.29 (0.0449) | | 21.58 (0.0463) | □ |
| GRID-SIMULATION-SECTION-28-AB-FAULT | LL-28 | 0.6910 (1.4472) | 0.7022 (1.4241) | 0.7027 (1.4231) | ◇ |
| GRID-SIMULATION-SECTION-28-BC-FAULT | LL-28 | | 0.6915 (1.4461) | 0.6910 (1.4472) | ◇ |
| GRID-SIMULATION-SECTION-28-AC-FAULT | LL-28 | 0.7022 (1.4241) | | | ◇ |
| GRID-SIMULATION-SECTION-28-ABCG-FAULT | 3LG-28 | 20.84 (0.0480) | 20.85 (0.0480) | 20.85 (0.0480) | ○ |
| GRID-SIMULATION-SECTION-28-ABC-FAULT | 3L-28 | 20.84 (0.0480) | 20.85 (0.0480) | 20.85 (0.0480) | ○ |

FIG. 12B

PGFA admittance and impedance magnitudes

| Test names: Test mode-fault location-type of fault | Groups | Phase A siemens (ohms) | Phase B siemens (ohms) | Phase C siemens (ohms) | FIG. 13 |
|---|---|---|---|---|---|
| GRID-SIMULATION-SECTION-38-AG-FAULT | LG-38 | 1.974 (0.5066) | | | X |
| GRID-SIMULATION-SECTION-38-BG-FAULT | | | 1.974 (0.5066) | | □ |
| GRID-SIMULATION-SECTION-38-CG-FAULT | | | | 1.974 (0.5066) | ◇ |
| GRID-SIMULATION-SECTION-38-ABG-FAULT | LLG-38 | 1.991 (0.5023) | 1.991 (0.5023) | | ○ |
| GRID-SIMULATION-SECTION-38-BCG-FAULT | | | 1.975 (0.5063) | 1.991 (0.5023) | |
| GRID-SIMULATION-SECTION-38-ACG-FAULT | | 1.991 (0.5023) | | 1.976 (0.5061) | |
| GRID-SIMULATION-SECTION-38-AB-FAULT | LL-38 | 0.5951 (1.6804) | 0.5951 (1.6804) | | |
| GRID-SIMULATION-SECTION-38-BC-FAULT | | | 0.5426 (1.8430) | 0.5951 (1.6804) | |
| GRID-SIMULATION-SECTION-38-AC-FAULT | | 0.5951 (1.6804) | | 0.5426 (1.8430) | |
| GRID-SIMULATION-SECTION-38-ABCG-FAULT | 3LG-38 | 1.988 (0.5030) | 1.987 (0.5033) | 1.990 (0.5025) | |
| GRID-SIMULATION-SECTION-38-ABC-FAULT | 3L-38 | 1.988 (0.5030) | 1.987 (0.5033) | 1.990 (0.5025) | |
| SIGNATURE LIBRARY- ID-4 (Optical power line sensors) | LG-4 | 0.270 (3.7037) | | | X |

FIG. 12C

| Accuracy% Eq. (16) | Precision% Eq. (17) | Sensitivity% Eq. (18) | Specificity% Eq. (19) | Error rate% Eq. (20) |
|---|---|---|---|---|
| 94.3% | 100% | 91.4% | 100% | 5.7% |

PHASE TO GROUND FAULT APPARENT ADMITTANCE METHOD WITH PHASE/GROUND BOUNDARIES FOR DETECTING FAULT TYPES

CROSS REFERENCE TO RELATED APPLICATION

The present application claims benefit of U.S. Provisional Application No. 63/434,227 filed on Dec. 21, 2022, all of the contents of which are incorporated herein by reference.

STATEMENT REGARDING FEDERALLY SPONSORED RESEARCH OR DEVELOPMENT

This invention was made with government support under project DE-AC05-00OR22725 awarded by the U.S. Department of Energy. The government has certain rights to this invention.

BACKGROUND

In a power grid circuit, protective relays can detect breaker states, types of electrical faults, and fault locations in a few seconds. Different protection functions of relays are available for a variety of applications such as for tripping/closing breakers, locating electrical faults in power grids or lines and detecting faulted phases. Protective relays have front panels with light-emitted-diodes (LEDs) that represents the ground and A, B, C phase states to identify types of electrical faults. These target LEDs are operated in a latching mode, and when a trip occurs the electrical fault identification process begins approximately one cycle later than when the electrical fault identification is completed. Then, once the electrical fault identification is defined, the front panel targets are activated based on the electrical fault identification and latched on until the relay target reset pushbutton or target reset command or target reset equation clears the targets. Also, the protective relay captures waveform data on every trip event, and the electrical fault summary is stored in the memory of the protective relay. This data can be collected to review event history and determine the electrical fault target LEDs even after they have been cleared by the resets. The detection of types of electrical faults by a protective relay with target LEDs is the first approach for protection engineers to observe the nature of events when an electrical fault occurs.

The electrical fault identification in most protective relays has been based on measuring both phase voltage and current magnitudes along with their angles. Detection of faulted phases to observe the types of electrical faults, can be performed by measuring over-current magnitudes at each phase because current magnitudes usually increase at fault states. In electrical fault scenarios at microgrids, with the power grid connected or islanded to hydropower sources, e.g., high spinning inertia cases, overcurrent relays could detect the faulted phases. However, faulted phases cannot be sensed by overcurrent relays in microgrids with small diesel generators, wind turbines and photovoltaic (PV) panels without energy storage systems, e.g., low spinning inertia cases, because of small electrical fault currents contributed by the low inertia of distributed energy sources. In addition, the most common electrical faults such as the phase to ground could be detected by measuring the voltage magnitudes, which usually decrease at faulted phases along power line sections. Considering that current and voltage magnitudes could increase and decrease, respectively, at faulted phases, a ratio between the measured phase voltages and currents at the power line sections or impedances can be used to detect the types of electrical faults.

Conventional methods for detecting types of electrical faults are focused on measuring impedances and sequence currents at the relay locations. The computationally efficient distance relay for power transmission lines method measures the impedance of electrical fault loops for multiple zones of distance protection elements. Another way, an electrical fault identification system for use in protective relays for power transmission lines method measures the angle between the negative and zero sequence currents, and it is based on an electrical fault identification selection logic that allows to select the types of electrical faults. The detection of the types of electrical faults using the angle between the negative and zero sequence phase currents is not completely accurate because it could have the same conditions for different electrical faults. In this method, the phase A to ground (AG)/phase B-C to ground (BCG) electrical faults, phase C to ground (CG)/phase A-B to ground (ABG) electrical faults, and phase B to ground (BG)/phase C-A to ground (CAG) electrical faults have an angle of 0°, 120°, and −120°, respectively. Based on that, the same angle between the negative and zero sequence currents is generated for different types of electrical faults.

Therefore, protection engineers need to observe the relay events after a fault situation to determine the nature of the incidents in detail, and this identification process takes a significant amount of time. The quick detection of faulted phases or type of faults by protective relay light indicators at the front panel is the first approach for protection engineers to observe the nature of events when a fault occurs, and it could be crucial to make an immediate decision about operating a breaker after a fault situation.

SUMMARY

A ground fault apparent (PGFA) admittance system and method based on measuring PGFA admittance magnitudes for faulted phase and non-faulted phase types with protective relay light indicators at a front panel.

The PGFA admittance method for detecting the types of electrical faults is based on measuring admittances with phase/ground boundaries.

The PGFA admittance method provides a quick approach for protection engineers to observe the nature of events when a fault occurs in an electrical power grid, and to make an immediate decision about operating a circuit breaker after a detected fault situation.

The PGFA admittance method provides a quick approach for protection engineers to observe the nature of events when a fault occurs in an electrical power grid by obviating the need to observe the relay events (in a sequence method) after a fault situation to determine the nature of the incidents in detail.

The PGFA admittance method exhibits a good selectivity and is a fast and reliable way to detect types of electrical faults at power lines.

The PGFA admittance method differentiates between the line-to-ground (LG) and double-line-to-ground (LLG) faults, which are the most common fault events in power grids because they are grounding.

In the ground fault apparent (PGFA) admittance method based on measuring PGFA admittance magnitudes for faulted phase and non-faulted phase types, boundaries of the PGFA admittance method to detect the type of faults are defined by phase and ground faulted zones. Then, the A, B, C phase and ground faulted zones are defined by the measurement of the total admittance and total zero sequence admittance of power line sections, respectively.

In one aspect, there is a provided a system for detecting types of electrical faults in a power line circuit of a power grid. The system comprises: a detector circuit for measuring multiphase voltage signals and multiphase current signals at a location of a power line circuit; a hardware processor associated with a memory storing program instructions in a computer system, the hardware processor running the program instructions configuring the processor to: obtain a total zero-sequence impedance value, a total positive-sequence impedance value and a total negative-sequence impedance value of a location of the power line circuit; compute a total zero-sequence admittance value as a function of the obtained total zero-sequence impedance value; compute a total admittance value as a function of the obtained total zero-sequence impedance value, the total positive-sequence impedance value and the total negative-sequence impedance value; for each phase of the multiphase voltage and current signals, obtain a corresponding phase ground fault admittance value at the location of a power line circuit; use fault type detection logic circuit to determine, based on obtained corresponding phase ground fault admittance values, an occurrence of an electrical fault and an electrical fault type at the power line circuit; and perform a corrective action at the power line circuit based on the determined electrical fault type.

In a further aspect, there is provided a system for protecting power transmission/distribution. The system comprises: one or more detectors configured to measure current signals corresponding to each respective phase of multiphase current through a power line of a power grid circuit and voltage signals corresponding to each respective phase of multiphase voltage for at least a particular section of the powerline; a breaker module configured to activate an electrical breaker at the particular section in response to receiving a fault notification indicative of (i) an occurrence of an electrical fault at the particular section and (ii) a type of the electrical fault; and a monitoring circuit communicatively coupled with the one or more detectors and the breaker module, the monitoring circuit configured to: pre-obtain one or more admittance magnitude boundaries for the powerline, one admittance magnitude boundary comprising a total admittance magnitude boundary value defining a phase fault zone indicating presence of an electrical phase fault condition; determine, based on the measured current signals of the multiphase current and voltage signals from the multiphase voltage, a corresponding phase to ground fault apparent admittance magnitude value for each phase; determine, for each phase, whether the corresponding determined phase to ground fault apparent admittance magnitude value for that phase is within the defined phase fault zone; and responsive to determining a measured phase to ground fault apparent admittance value for a particular phase is within the defined phase fault zone, provide a phase fault notification to the breaker module of an electrical fault occurrence for that particular phase.

In a further aspect, there is provided a method for detecting types of electrical faults in a power line circuit of a power grid. The method comprises: measuring, using a detector circuit, multiphase voltage signals and multiphase current signals at a location of a power line circuit; obtaining, using a programmed hardware processor, a total zero-sequence impedance value, a total positive-sequence impedance value and a total negative-sequence impedance value of a location of the power line circuit; computing, using the programmed hardware processor, a total zero-sequence admittance value as a function of the obtained total zero-sequence impedance value; computing, using the programmed hardware processor, a total admittance value as a function of the obtained total zero-sequence impedance value, the total positive-sequence impedance value and the total negative-sequence impedance value; for each phase of the multiphase voltage and current signals, obtaining, using the programmed hardware processor, a corresponding phase ground fault admittance value at the location of a power line circuit; determining, using a fault type detection logic circuit, and based on obtained corresponding phase ground fault admittance values, an occurrence of an electrical fault and an electrical fault type at the power line circuit; and performing, using the programmed hardware processor, a corrective action at the power line circuit based on the determine electrical fault type.

In yet another aspect, there is provided a method comprising presetting, at a protective relay associated with a power line section of a power grid circuit, one or more electrical fault condition boundary parameters; obtaining current signals and voltage signals corresponding to respective multiphase current and multiphase voltage carried at the power line section; obtaining, based on the current signals of multiphase current and the multiphase voltage signals from the multiphase voltage, a corresponding phase to ground fault apparent admittance magnitude value associated with each phase at the power line section; determining, for each phase, whether the corresponding determined phase to ground fault apparent admittance magnitude value exceeds one or more of the electrical fault condition boundary parameters; and responsive to determining a measured phase to ground fault apparent admittance value for a particular phase exceeds one or more of the electrical fault condition boundary parameters, providing a phase fault notification to a circuit breaker module associated with the protective relay at the power line section of an electrical fault occurrence and type of electrical fault for that particular phase at that power line section; and configuring the circuit breaker module at the power line section in accordance with the electrical fault type.

A computer readable storage medium storing a program of instructions executable by a machine to perform one or more methods described herein also may be provided.

BRIEF DESCRIPTION OF THE DRAWINGS

Further features as well as the structure and operation of various embodiments are described in detail below with reference to the accompanying drawings. In the drawings, like reference numbers indicate identical or functionally similar elements.

FIG. 6 depicts an example inverse time overcurrent relay circuit used with saturated measurement transformer models in the example simulation embodiment;

FIG. 7 shows a fault block circuit used for the simulating of grid test events that include the effect of the electrical fault resistance in an embodiment of a test simulation;

FIG. 8 shows a table depicting example Grid simulation tests performed for the example utility power grid circuit of FIG. 5;

FIG. 9 shows a table 550 depicting the steps to calculate the phase/ground boundaries of the PGFA admittance method for the faulted zones;

FIG. 11A depicts a circuit model embodying test mode settings for the example PGFA admittance method simulation in an embodiment;

FIG. 11B depicts a circuit model embodying a fault type detection scope for visualizing example PGFA admittance values in an example simulation in an embodiment;

FIGS. 12A-12C are tables depicting measured PGFA admittance and impedance magnitudes for each of fault states in an exemplary simulation of the utility power grid circuit of FIG. 5;

DETAILED DESCRIPTION

This disclosure provides a phase to ground fault apparent (PGFA) admittance approach with phase/ground boundaries. A PGFA impedance is usually measured by distance elements for mho relays, which are commonly set by referring to a resistance-reactance (R-X) diagram. This diagram represents the variation over time of the impedance of the transmission line at the relay location, e.g., apparent impedance. In an embodiment, a PGFA impedance algorithm is modified to measure magnitudes of the inverse of impedance, i.e., admittance, to detect types of electrical faults for the A, B and C phases of multiphase voltage and multiphase current signals, by implementing a phase/ground detection logic block.

Figure 1:
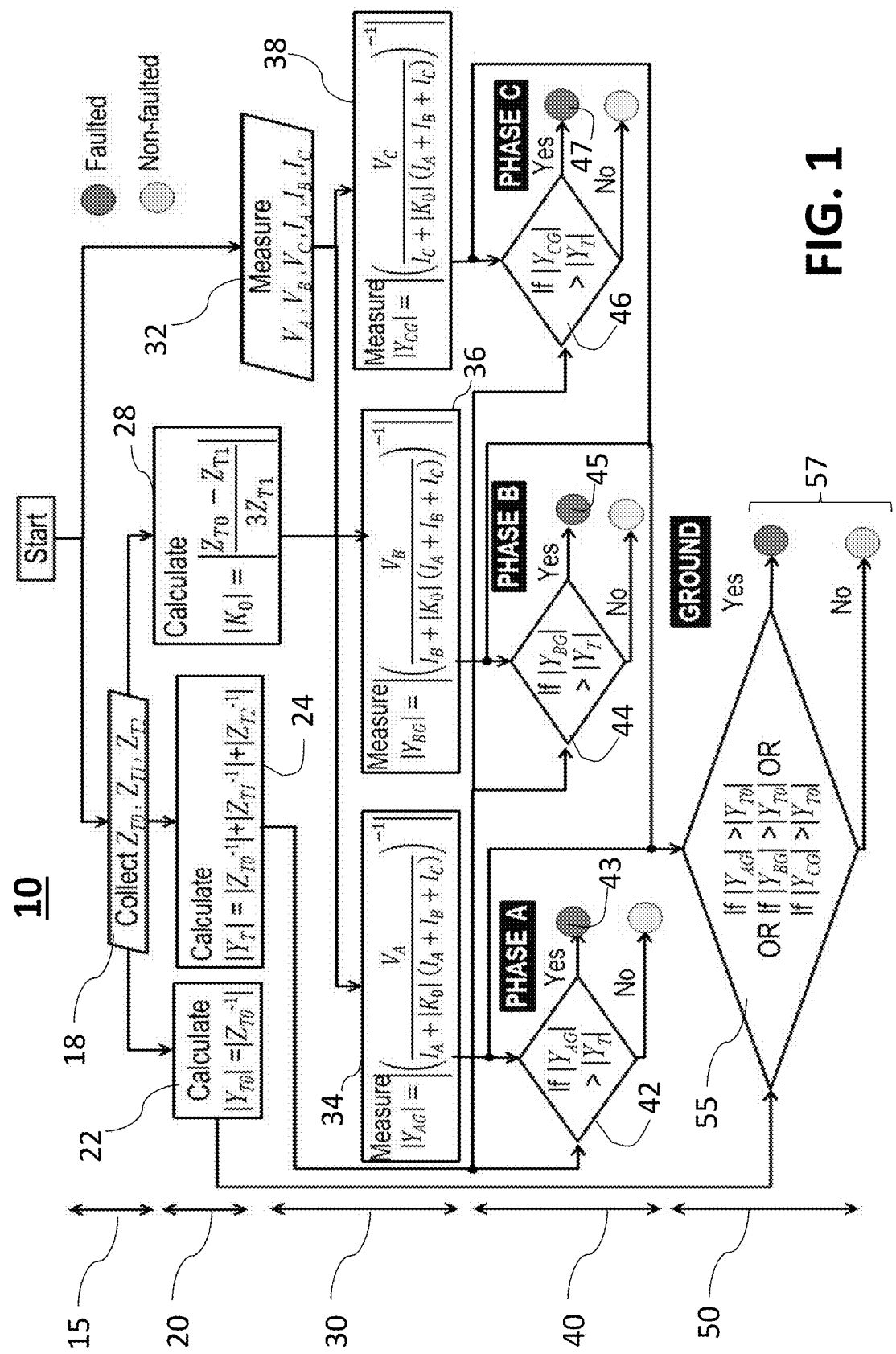
FIG. 1 depicts a PGFA admittance with phase/ground boundaries approach to detect the types of electrical faults in a power grid network.

FIG. 1 depicts a PGFA admittance method 10 with phase/ground boundaries to detect the types of electrical faults such as line-ground (LG), line-line-ground (LLG), line-line (LL), triple line ground (3LG) and triple line (3L)-type electrical faults. As shown in FIG. 1, the PGFA admittance algorithm 10 with phase/ground boundaries use for detecting types of electrical faults generally includes a data collection step 15 to collect total impedance values, a calculation step 20 to calculate total admittance values, measurement steps 30 to obtain phase to ground fault apparent admittances, phase fault condition steps 40 to determine faulted or non-faulted phase states, and ground fault condition steps 50 to determine faulted or non-faulted ground condition states.

For data collection step 15, the system collects at 18 the total impedance magnitudes of the zero ($|Z_{T0}|$), positive ($|Z_{T1}|$), and negative ($|Z_{T2}|$) sequences of the power line sections that will be used to set the calculations. Based on the collected total zero-sequence impedance $|Z_{T0}|$, there is calculated at 22 total zero-sequence admittance value $|Y_{T0}|$. Based on the collected total zero-sequence impedance $|Z_{T0}|$ and the total positive-sequence impedance $|Z_{T1}|$ and total negative-sequence $|Z_{T2}|$, there is calculated a total admittance value $|Y_T|$. Calculation step 20 further includes calculating at 28 a total zero-sequence compensation factor $|K_0|$.

Continuing in FIG. 1, the measuring steps 30 includes measuring at 32 each respective phase to ground voltages $V_A$, $V_B$, $V_C$ at the relay location and corresponding phase currents $I_A$, $I_B$, $I_C$ at the relay location. The total zero-sequence compensation factor $|K_0|$ and the phase currents ($I_A$, $I_B$, $I_C$) and phase to ground voltages ($V_A$, $V_B$, $V_C$) measured at the relay location are used to calculate the magnitudes of the PGFA admittance for the A, B and C phases. Measuring steps 30 further include at 34 measuring the phase A to ground fault apparent admittance value $|Y_{AG}|$ and at 36 measuring the phase B to ground fault apparent admittance value $|Y_{BG}|$, and at 38 measuring the phase C to ground fault apparent admittance value $|Y_{CG}|$. For each respective phase, the respective $|Y_{AG}|$, $|Y_{BG}|$ and $|Y_{CG}|$ phase to ground fault apparent admittance values are used to detect the types of electrical faults based on the phase and ground conditions for the protective relay's LEDs. In particular, a phase A fault condition 43 can be detected at 42 based on comparison of the $|Y_{AG}|$ and total admittance value $|Y_T|$; similarly, a phase B fault condition 45 can be detected at 44 based on comparison of the $|Y_{BG}|$ and total admittance value $|Y_T|$ and a phase C fault condition 47 can be detected at 46 based on comparison of the $|Y_{CG}|$ and total admittance value $|Y_T|$. Further, at 55, FIG. 1, respective phase A, phase B and phase C ground "yes" or "no" fault conditions 57 can be determined based on comparison of the respective phase $|Y_{AG}|$, $|Y_{BG}|$ and $|Y_{CG}|$ values and total zero-sequence admittance value $|Y_{T0}|$.

Phase to Ground Fault Apparent Admittance with Phase/Ground Boundaries

With more particularity, in the PGFA admittance method 10 with phase/ground boundaries as shown in FIG. 1, there is first performed steps 20 of measuring the admittance, i.e., inverse impedance, magnitude to detect the types of electrical faults at the power line circuit. Then, the phase to neutral voltages and phase currents at a breaker location are collected at 30 to calculate the PGFA admittance magnitude during faulted and non-faulted states. Distance protection relays measure the apparent impedances to detect the electrical faults in transmission lines. Considering the A phase, for instance, the PGFA impedance ($Z_{ag}$) is computed based on the instantaneous voltages and currents according to Eq. (1) as follows:

$$Z_{ag} = \frac{V_a}{I_a + K_0 \, (3I_0)} = \frac{V_a}{I_a + k_0(I_a + I_b + I_c)} \tag{1}$$

where $Z_{ag}$ is the PGFA impedance for phase A in ohms, $V_a$ is the phase A to neutral voltage in volts, $I_a$ is the phase A current in amps (and similarly for $I_b$ and $I_c$), $I_a = (I_a + I_b + I_c)/3$ is the zero-sequence current in amps, and $K_0$ is the total zero sequence current compensation factor. The total zero sequence current compensation factor is given by Eq. (2) as follows:

$$K_0 = \frac{Z_{T0} - Z_{t1}}{3Z_{T1}} \tag{2}$$

where $Z_{T0}$ and $Z_{T1}$ are total zero and positive sequence impedances in ohms, respectively, and expressed in complex notation with i as the imaginary unit.

The magnitude ($|K_0|$) and angle ($K_{0<}$) of the zero sequence current compensation factor for the power line sections are used to set the PGFA admittance algorithm. Then, $|K_0|$ and $K_{0<}$ are calculated according to Eqs. (3) and (4), respectively, as follows:

$$|K_0| = \left|\frac{Z_{T0} - Z_{t1}}{3Z_{T1}}\right| \tag{3}$$

$$K_{0<} = \tan^{-1}\left(\frac{K_{0\,imag}}{K_{0\,real}}\right) \tag{4}$$

where $K_{0\,imag}$ and $K_{0\,real}$ are the imaginary and real part of the zero sequence current compensation factor magnitude.

A total resistance ($R_T$) is calculated with the total positive ($R_T$) and zero sequence resistance ($R_{T0}$) of the power line sections and Eq. (5) as follows:

$$R_T = R_{T1} + R_{T2} + R_{T0} = 2 \, R_{T1} + R_{T0} \tag{5}$$

A total reactance ($X_T$) is calculated with the total positive ($X_{T1}$) and zero sequence ($X_{T0}$) reactance of the power line sections according to Eq. (6) as follows:

$$X_T = X_{T1} + X_{T2} + X_{T0} = 2 \, X_{T1} + X_{T0} \tag{6}$$

Total zero sequence current compensation factor magnitude ($|K_0|$) and angle ($K_{0<}$) are used to set the PGFA admittance algorithm. Total ($|Y_T|$) and zero sequence ($|Y_{T0}|$) admittance magnitudes are used to select the faulted phase and ground conditions, respectively. The $|Y_T|$ is calculated at 24 of FIG. 1 with the total resistance ($R_T$) and reactance ($X_T$) of the power line sections according to Eq. (7) as follows:

$$|Y_T| = \left|\left(\frac{R_T}{R_T^2 + X_T^2}\right) + i\left(\frac{-X_T}{R_T^2 + X_T^2}\right)\right| \tag{7}$$

The $|Y_{T0}|$ is calculated at 22 of FIG. 1 with the total zero sequence resistance ($R_{T0}$) and reactance ($X_{T0}$) of the power line sections according to Eq. (8) as follows:

$$|Y_{T0}| = \left|\left(\frac{R_{T0}}{R_{T0}^2 + X_{T0}^2}\right) + i\left(\frac{-X_{T0}}{R_{T0}^2 + X_{T0}^2}\right)\right| \tag{8}$$

The boundaries of the PGFA admittance method to detect the types of electrical faults with the protective relay's LEDs were defined by the phase and ground faulted zones. The A, B and C phase and ground faulted zones are set by $|Y_T|$ and $|Y_{T0}|$, respectively. The A, B and C phase faulted zone for the measured PGFA admittance magnitudes are given by Eq. (9) in siemens, as follows:

$$|Y_{pg}| = |Y_T| \text{ (phase faulted zone)} \tag{9}$$

and the ground faulted zone for the measured PGFA admittance magnitudes is given by Eq. (10) in siemens.

$$|Y_{pg}| = |Y_T| \text{ (ground faulted zone)} \tag{10}$$

The PGFA admittance magnitude for a generic phase p is given by Eq. (11).

$$|Y_{pg}| = \left|\left(\frac{V_p}{I_p + |K_0|(I_A + I_B + I_C)}\right)^{-1}\right| \tag{11}$$

Another way to represent the admittance by Eq. (12).

$$Y_{pg} = |Y_{pg}| \cos \vartheta_{pg} + i|Y_{pg}| \sin \vartheta_{pg} = G_{pg} + i \, B_{pg}, \tag{12}$$

where $Y_{pg}$ is the measured PGFA admittance in siemens, $G_{pg}$ is the measured PGFA conductance in siemens, $B_{pg}$ is the measured PGFA susceptance in siemens, and $\theta_{pg}$ is the measured angle of the PGFA admittance in degrees.

Figure 2:
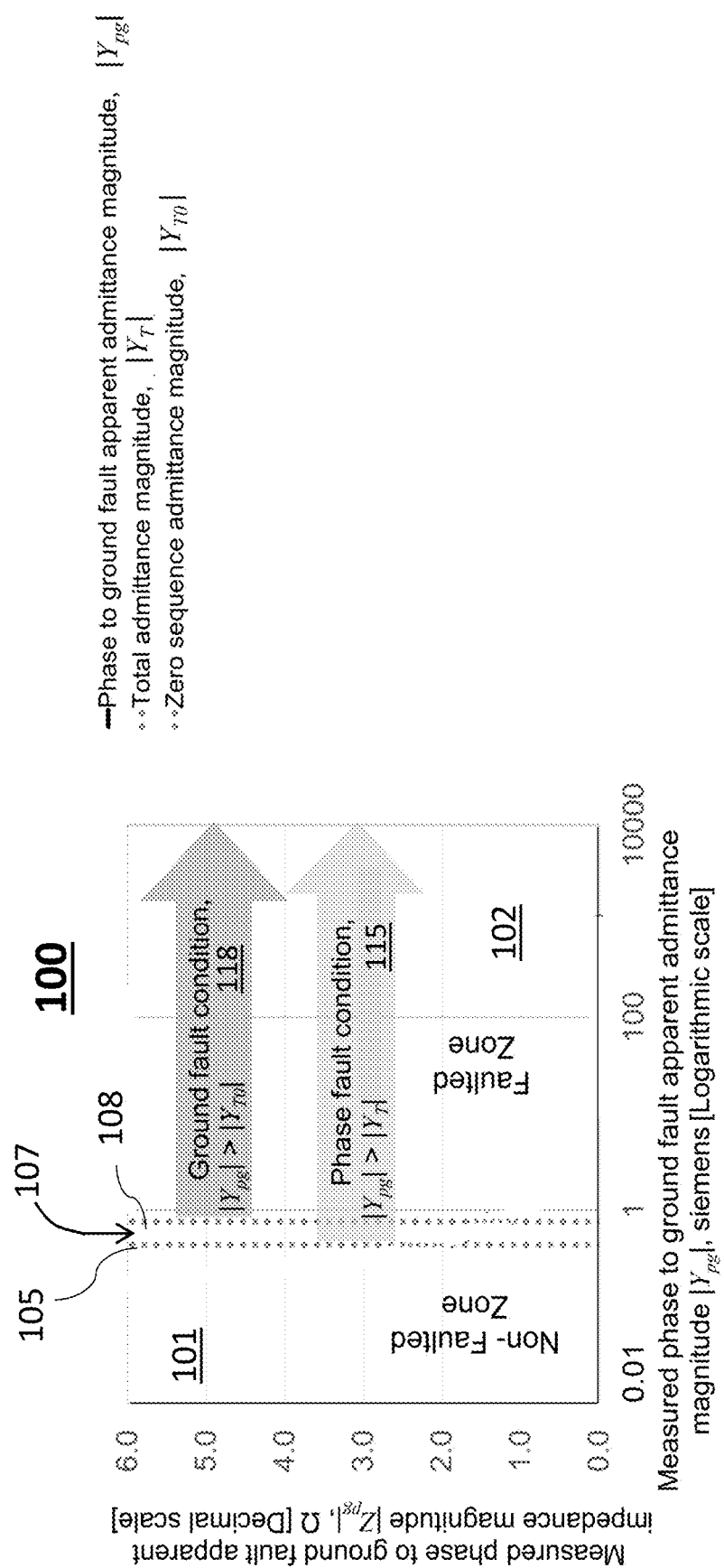
FIG. 2 depicts a graph upon which is plotted measured PGFA admittance magnitudes for defining the electrical line fault and ground fault states in an embodiment.

FIG. 2 generally illustrates a graph 100 upon which can be visually plotted measured PGFA admittance magnitudes for detecting the electrical line fault and ground fault states in an embodiment. As shown in FIG. 2, the graph 100 is used to plot PGFA measured phase to ground fault apparent admittance value $|Y_{pg}|$ (in siemens) along the X-axis (a logarithmic scale) and their corresponding phase to ground fault apparent impedance magnitude impedance values $|Z_{pg}|$ (in ohms) for a phase p=A, B or C along the Y-axis. In a non-limiting illustrative embodiment, based upon a calculated total admittance magnitude boundary $|Y_T|$ 105, there is defined non-faulted zone 101 where measured phase to ground fault apparent admittance magnitude values do not exceed total admittance magnitude boundary $|Y_T|$ 105. Similarly, there is defined a phase faulted zone 102 defining a phase fault condition 115 for a particular phase p when measured phase to ground fault apparent admittance magnitude values do exceed total admittance magnitude boundary $|Y_T|$ 105, i.e., when $|Y_{pg}|>|Y_T|$. Within phase faulted zone 102 there is further defined a ground fault condition 118 when measured phase to ground fault apparent admittance magnitude values exceed total zero sequence admittance magnitude boundary $|Y_{T0}|$ 108, i.e., when $|Y_{pg}|>|Y_{T0}|$ indicating a detected electrical phase line to ground fault (e.g., LG, LLG, 3LG) condition for a particular phase p. For measured phase to ground fault apparent admittance magnitude values $|Y_{pg}|$ between total admittance magnitude $|Y_T|$ 105 and total zero sequence admittance magnitude $|Y_{T0}|$ 108, i.e., $|Y_T|>|Y_{pg}|>|Y_{T0}|$ will lie within a fault zone 107 indicating only an electrical phase fault (e.g., LL, 3L) condition for a particular phase p.

Test Scenarios

The PGFA admittance method with phase/ground boundaries was evaluated to detect types of electrical faults by using grid simulation and signature library event modes. In an embodiment, the assessment of protective relay algorithms is usually performed with software simulations, and models that represent ideal current and voltage sensors with relays in the loop. Then, simulated electrical fault currents are not affected by saturation of measurement transformers as they would be in a real scenario. In an embodiment, the PGFA admittance model was evaluated with the MATLAB/Simulink software and using saturated measurement transformer models, at a 12.47 kV EPB of a known utility grid. On the other side, optical power line sensors were not available in MATLAB/Simulink libraries. Then, signature library events, which included multiple real data sets collected on the field, at a 46 kV EPB of a known electrical substation, were applied to assess also the PGFA admittance model.

The PGFA admittance algorithm 10 of FIG. 1, was simulated with a MATLAB/Simulink software to test and validate the detection of different electrical fault types.

The tests using the MATLAB/Simulink software were based on using two different utility grids at an electric power board (EPB) of an electrical substation. The signature library event mode using a 46 kV EPB of an electrical substation, and the grid simulation mode using the 12.47 kV EPB of a utility grid. The signature library mode 201 measured the currents and voltages, e.g., 26.6 kV phase to ground voltage, from optical power line sensors, and the grid simulation mode 202 collected the currents and voltages, e.g., 7.2 kV phase to ground voltage, from saturated measurement transformer models in MATLAB/Simulink.

Figure 3:
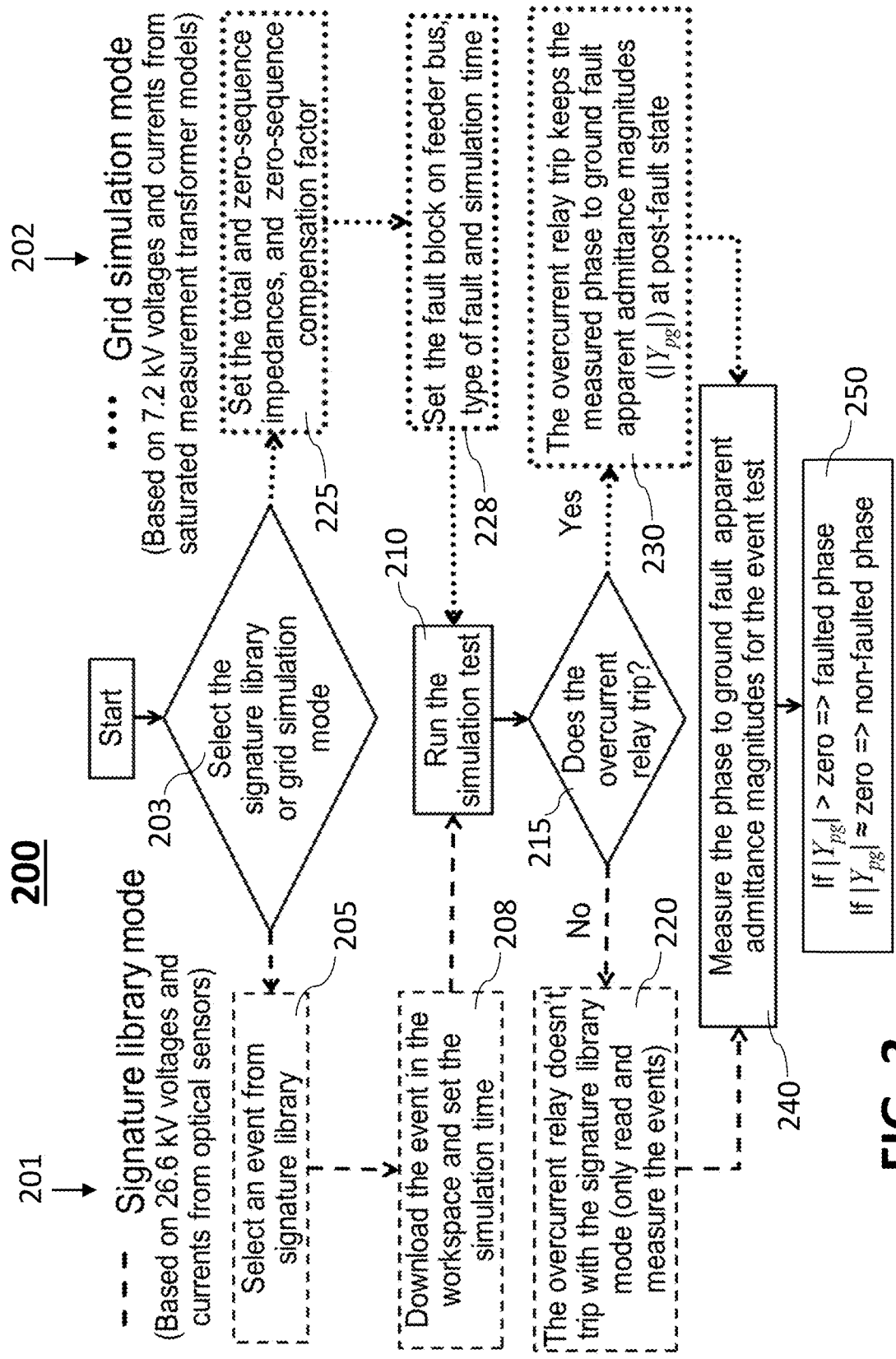
FIG. 3 is a flow diagram 200 depicting test method scenarios used to evaluate the PGFA admittance method with phase/ground boundaries.

FIG. 3 is a flow diagram 200 depicting test method scenarios used to evaluate the PGFA admittance method with phase/ground boundaries. The test scenarios were based on using a signature library mode 201 and grid simulation mode 202, by running a selected event and simulation test, respectively. The PGFA admittance magnitude for the faulted and non-faulted phases were measured, resulting in greater than zero and near zero, respectively.

In FIG. 3, upon selection of the signature library mode at 203, the method at 205 selects one event of four example sensor events labeled ID-1, ID-2, ID-3, ID-4 from the Table 1, and the method at 208 downloads the selected one sensor event in the MATLAB workspace and sets the simulation time. Then at 210, the simulation test for this event is run.

In one example use-case, at 215, a determination is made as to whether the overcurrent relay trips. In the example use-case for the signature library mode, it is detected that the over-current relay does not trip at 220 because the stored events were read. While currents and voltages of the signature library event were being read, the PGFA admittance magnitudes for the phase p, i.e., p=A, B, and C phases, were plotted at 240, observing the faulted and non-faulted phases at 250.

In the grid simulation mode 202 of FIG. 3, the events were generated by the simulation of a 12.47 kV EPB of a utility grid in MATLAB/Simulink. Given a known power grid, at 225, FIG. 3, the method sets the total impedance ($|Z_T|$), and zero sequence impedance ($|Z_{T0}|$), and zero sequence current compensation factor ($|K_0|$) for the PGFA admittance algorithm 10 of FIG. 1. Then, at 228, the method selects the electrical fault location and type of electrical fault and sets the simulation time to run the tests. Then at 210, the simulation test is run for this event. In this example use-case, at 215, a determination is made as to whether the overcurrent relay trips. In the example use-case for the grid simulation mode, it is detected that the over-current relay trips because the pre-fault, fault, and post-fault states are generated for each event. At 230, FIG. 3, the trip signal of the over-current relay configures the system to keep the measured PGFA admittance magnitude of the fault state during the post-fault state. Currents and voltages of the grid simulation were generated, and the PGFA admittance magnitudes for the A, B, and C phases were plotted at 240, observing the faulted and non-faulted states at 250.

Signature Library Event Mode

In the signature library event mode 201 of FIG. 3, the phase currents and voltages were collected from optical power line sensors (e.g., 26.6 kV phase to neutral voltage) deployed on the field. The optical power line sensor events were stored into a signature library as COMTRADE files. As known, COMTRADE is a file format (Common format for Transient Data Exchange for power systems) for storing data related to transient power system disturbances. Then, the phase current/voltage events from the optical power line sensors were converted into MATLAB files to be used with the PGFA admittance algorithm. These signature library events were given by a service restoring of the A, B, and C phase feeders (signature ID-1), phase C to ground electrical fault that blows fuse (signature ID-2 and ID-3), and phase B to ground electrical fault (signature ID-4). Table 1 shows these signature library events.

TABLE 1

Signature library events and states

| Names | Types of tests (states) | Sensors |
|---|---|---|
| ID-1 | Service restoring of A, B, and C phase feeders (non-fault state) | Optical power line sensor (26.6 kV phase to neutral) |

TABLE 1-continued

Signature library events and states

| Names | Types of tests (states) | Sensors |
|---|---|---|
| ID-2 | Phase C to ground electrical fault that blows fuse (post-fault state) | voltage) for measuring phase currents and voltages |
| ID-3 | Phase C to ground electrical fault that blows fuse (post-fault state) | |
| ID-4 | Phase B to ground electrical fault (pre-fault, fault, and post-fault states) | |

Grid Simulation Event Mode

Figure 4:
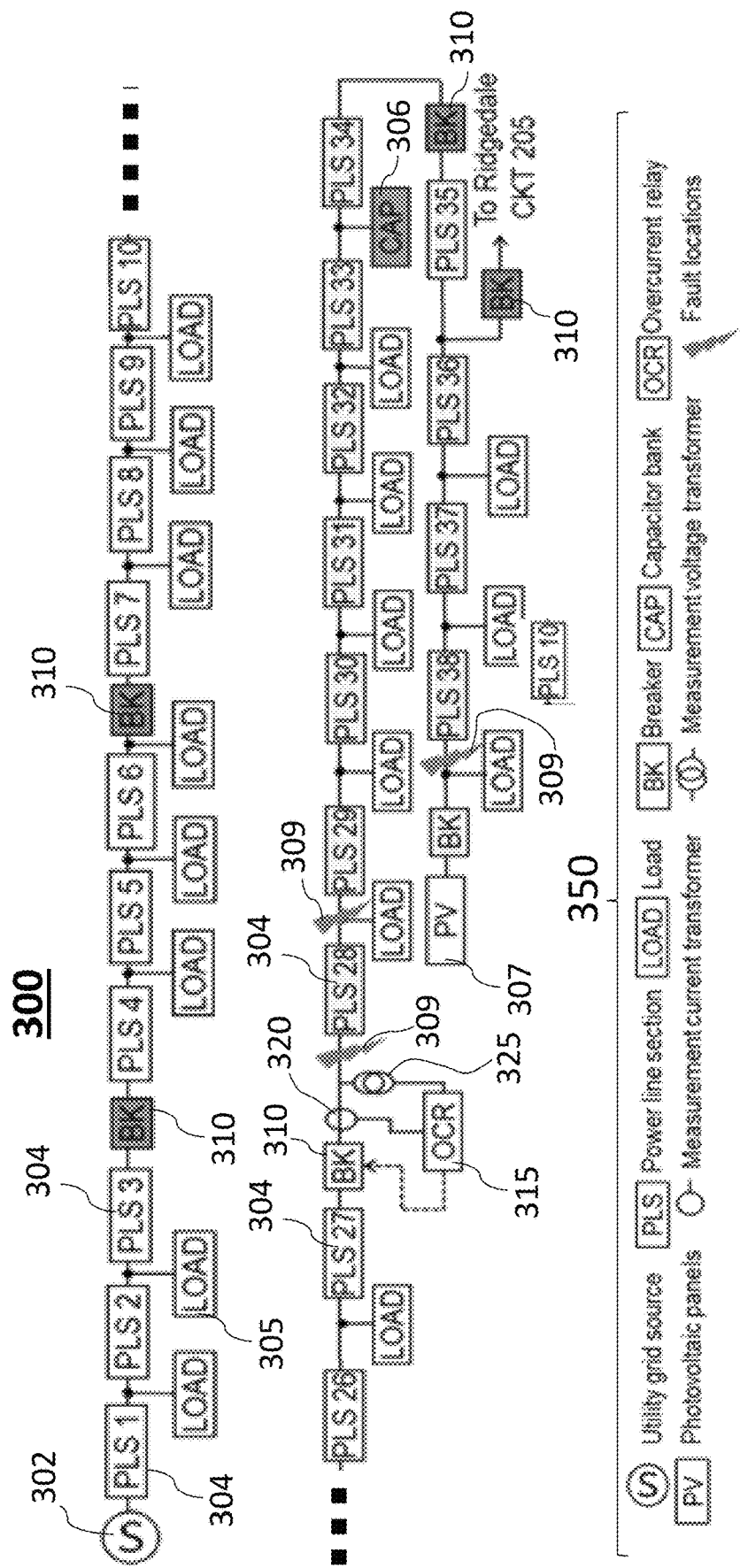
FIG. 4 depicts a single-line diagram of a portion of an example power utility grid circuit in an example use-case scenario for detecting electrical line fault and ground fault states according to the methods herein.

In the grid simulation event mode 202 of FIG. 3, part of the 12.47 kV EPB of the utility grid was simulated with MATLAB/Simulink software. FIG. 4 depicts an exemplary single-line diagram of an example power grid circuit model 300 used in the MATLAB/Simulink software simulation. This network configuration was a radial power system, e.g., 7.2 kV phase to ground voltage, that was fed by a three-phase source 302 with a Wye-ground configuration (a power grid substation). In legend 350 are shown the symbols of the elements for the radial power system. The example power grid circuit model 300 being simulated shows a power grid circuit configuration including a utility grid source 302 feeding serial connections of a power line sections (PLS) 304, respective loads 305 and circuit breakers (BK) 310, a capacitor bank (CAP), a photovoltaic panel 307, an overcurrent relay (OCR) 315 coupled to a measurement current transformer 320 and a measurement voltage transformer 325 and faults 309 at three locations. In the power circuit model simulation, the overcurrent relay 315 running the PGFA admittance algorithm was located between the PLS 304 labeled "27" and PLS 304 labeled "28", to detect the faulted phases for the line to ground (LG), double line to ground (LLG), line to line (LL), three line (3L), and three line to ground (3LG) electrical faults 309 located near the OCR's breaker 310, at the end of the power line section labeled "28" and at the end of the power line section labeled "38".

Figure 5:
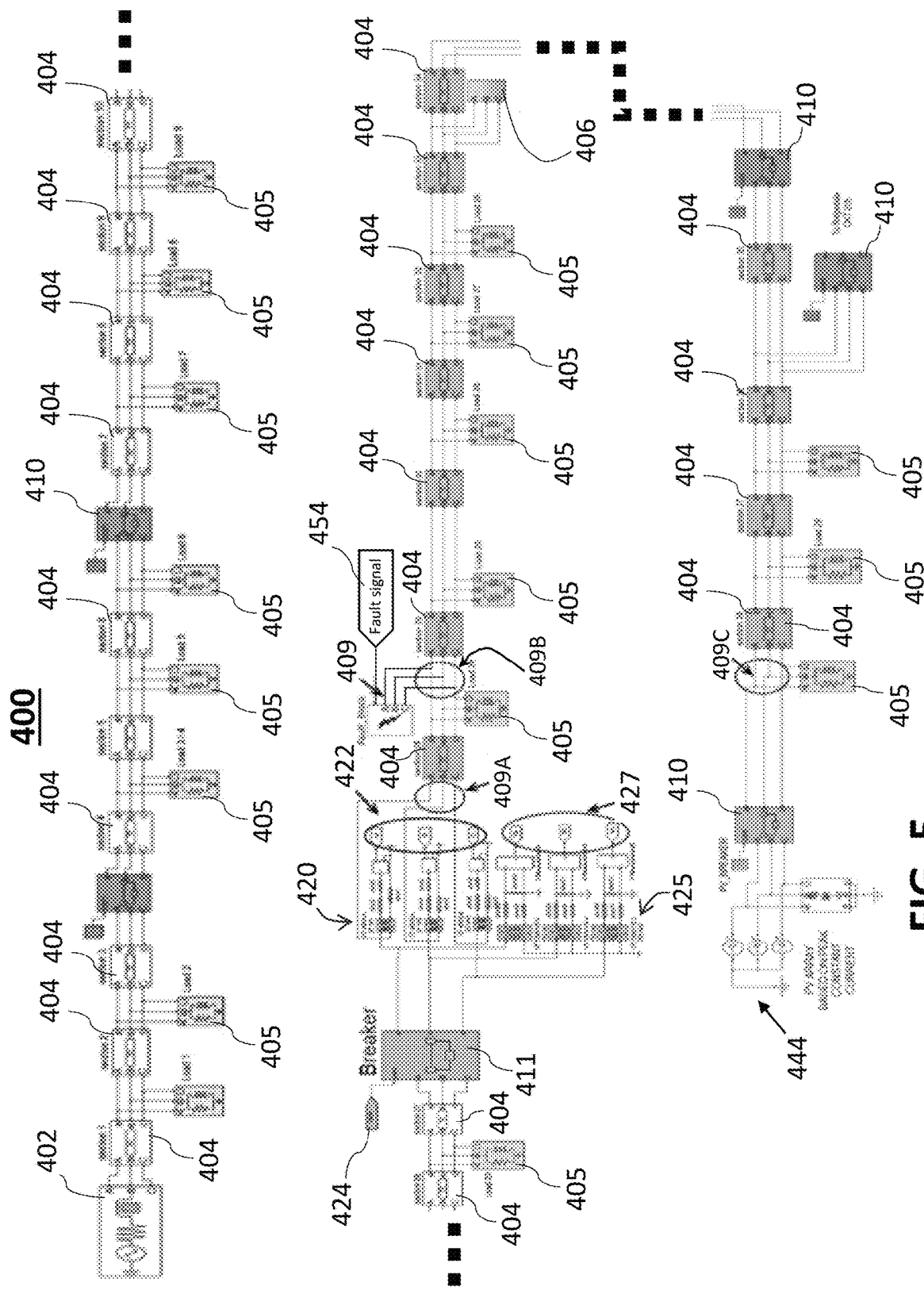
FIG. 5 depicts a three-line diagram in MATLAB/Simulink model corresponding to the single line diagram of FIG. 4 in an example simulation embodiment.

FIG. 5 depicts a three-line diagram in MATLAB/Simulink power grid circuit model 400 corresponding to the single line diagram of the power grid circuit 300 of FIG. 4 in an example embodiment. As shown in FIG. 5, the three-line diagram for the MATLAB/Simulink model 400 depicts the simulated power grid circuit including breaker 411, an inverse time over-current relay 415 shown in FIG. 6, a fault block 409 providing faults at fault locations 409A, 409B and 409C using a fault block circuit 459, three current transformers 420 providing current signals $I_a$, $I_b$, $I_c$ 422 for each respective phase p of three phases A, B and C, and three voltage transformers 425 providing voltage signals $V_a$, $V_b$, $V_c$ 427. This power grid circuit 400 shown in FIG. 5, included the utility source 402, power line sections 404, feeder loads 405, breakers 410, and capacitor banks 406. The power line sections 404 were simulated with a three-phase 71 section line block. The electrical faults were generated by a fault block 409 responsive to a received fault signal 454 generated by the fault block circuit 459 shown in FIG. 7, that tripped the electrical fault state at 0.5 s. In FIG. 5, for the example simulation, the LG, LL, LLG, 3L, and 3LG electrical faults were located near the breaker 411, shown at 409A, at the end of the power line section labeled "28", shown at 409B, and at the end of the power line section labeled "38", shown at 409C, for the tests. In FIG. 5, the results were collected as MATLAB files. In an embodiment, an inverse time overcurrent relay circuit 415 shown in FIG. 6 (or such power line protector having a relay trip time inversely proportional to the applied fault current) with saturated measurement transformer models 420 shown in FIG. 5 (MATLAB/Simulink) were used in the example simulations. The phase currents 422 and phase to neutral voltages 427 at the breaker location 411, shown in FIG. 5, were collected from the saturated current transformers (CTs) 420 and voltage transformers (VTs) 425, which were connected to a simulated cable lead of 1.5 ohms, with relay impedances of 0.0108 ohms for CTs and 240,000 ohms for VTs. The ratios of the CTs and VTs were 400/5 A and 7,200/115 V, respectively.

In an embodiment, the inverse time over-current relay circuit 415, shown in FIG. 6, was set with a time dial setting (TDS) of 1.05 s, current transformer ratio (CTR) of 80, relay current pickup ($I_P$) of 10 amps, and IEEE extremely inverse curve as set forth in Eq. (13) as follows:

$$T_R = \frac{TDS}{7} \times \left(0.1217 + \frac{28.2}{\left(I_{primary}/CTR/I_P\right)^2 - 1}\right) \times 60 \qquad (13)$$

where $T_R$ is the relay time in cycles and $I_{primary}$ is the primary current in amps. The inverse time over-current relay circuit 415 shown in FIG. 6 allowed to open the breaker 411 shown in FIG. 5, at the electrical fault currents. That is, as shown in FIG. 6, based on collecting the signals 422 from the current transformers 420 shown in FIG. 5, the inverse-time over current relay circuit 415 shown in FIG. 6 generates a trip signal 424 which is received at the corresponding breaker 411 shown in FIG. 5. The grid simulation events were run for 3 s to observe the pre-fault, fault, and post-fault states for each test. The simulated grid test events included the effect of the electrical fault resistance because the fault block 409, shown in FIG. 5, was set with an electrical fault resistance of 0.001 ohms. The fault block 409 was triggered by the "Fault Signal" that was generated by the circuit 459 shown in FIG. 7

FIG. 8 depicts a table 500 having a column 510 showing the grid simulation (mode) tests of the example simulations of the power grid circuit of FIG. 5. Table 500 shows a column 515 of the grid simulation test types, such as AG, BG, CG, AB, BC, AC, ABG, BCG, ACG, ABC and ABCG type faults, for each of the three example electrical fault locations 409A, 409B, 409C shown in FIG. 5 obtained based on measurements of saturated CT MATLAB/Simulink models and saturated VT MATLAB/Simulink models. As shown in FIG. 8, for each simulated fault location 409A, 409B, 409C, there is performed 33 tests, i.e., AG, BG, CG, AB, BC, AC, ABG, BCG, ACG, ABC and ABCG for each of pre-fault, fault and post-fault states resulting in a total of 99 states, where A, B, C are the lines (phases) and G is ground state.

In an embodiment, the PGFA admittance method was based on measuring the magnitudes of the PGFA admittance at the faulted phases. Then, the positive, negative, and zero sequence impedances of the power line sections 404, shown in FIG. 5, from the breaker location shown at 411 to the last feeder 444 (i.e., a summation of the impedances for each power line section from the power line sections labeled "28" to "38") were computed. The positive and negative sequence impedances of all power line sections 404 were similar. The total positive sequence ($Z_{T1}$) and zero sequence ($Z_{T0}$) impedances in ohms were calculated using Eqs. (14) and (15), respectively, and expressed in standard complex notation with i as the imaginary unit resistance.

$$Z_{T1} = \Sigma\, R_{L1} + i\, \Sigma\, X_{L1} = R_{T1} + i\, X_{T1} \quad (14)$$

where $R_{T1}$ is the total positive sequence resistance in ohms, $X_T$ is the total positive sequence reactance in ohms, $R_L$ is the positive sequence resistance in ohms of each power line section (each transmission line) 404 from the location of the sensor to the end of the line (a summation), and $X_{L1}$ is the positive sequence reactance of each power line section (each transmission line) 404 in ohms from the location of the sensor (at breaker 411) to the end of the line (a summation).

$$Z_{T0} = \Sigma\, R_{L0} + i\, \Sigma\, X_{L0} = R_{T0} + i\, X_{T0} \quad (15)$$

where $R_{T0}$ is the total zero sequence resistance in ohms, $X_{T0}$ is the total zero sequence reactance in ohms, $R_{L0}$ is the zero sequence resistance of each power line section in ohms, and $X_{L0}$ is the zero sequence reactance of each power line section in ohms.

FIG. 9 shows a table 550 depicting the steps to calculate the phase/ground boundaries of the PGFA admittance method for the faulted zones. The total resistance ($R_T$) and reactance ($X_T$), and total zero sequence resistance ($R_{T0}$) and reactance ($X_{T0}$) from the power line sections labeled "28" to "38", shown in FIG. 5, were calculated. Then, the magnitudes for the total ($|Y_T|$) and total zero sequence ($|Y_{T0}|$) admittances were estimated by Eq. (7) and Eq. (8), respectively, to define the phase and ground faulted zone boundaries for the PGFA admittance method. The boundaries of the PGFA admittance method for the phase and ground faulted zones were $|Y_T|$>0.435 siemens and $|Y_{T0}|$>0.754 siemens, respectively.

Experimental Model

Figure 10:
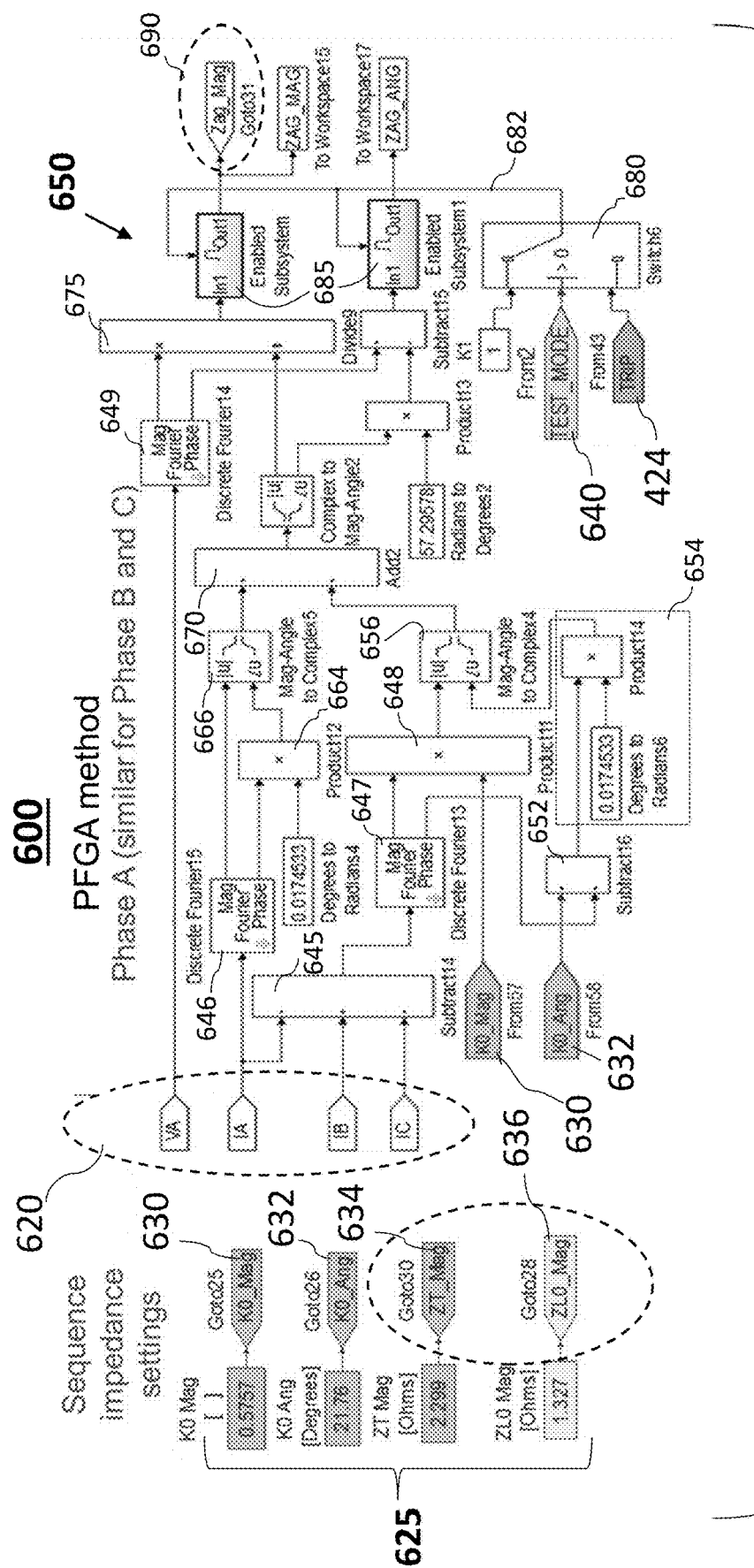
FIG. 10 depicts a circuit model of the PGFA method with sequence impedance settings and PGFA impedance algorithm processing block.

The experimental model was performed with MATLAB/Simulink software and set at the 12.47 kV EPB of the example utility grid shown in FIG. 5. FIG. 10 shows an embodiment of the algorithm model 600 for the PGFA impedance, showing the sequence impedance setting inputs, shown at 625, FIG. 10, and the PGFA impedance algorithm block shown at 650 in FIG. 10. The sequence impedance setting inputs, or pre-setting values 625 shown in FIG. 10, include the magnitude 630 of the total zero sequence current compensation factor $K_0$, the angle 632 of the zero sequence compensation factor $K_0$, and impedance boundary values including the total magnitude value of the impedance ZT (Ohms) 634 and magnitude value of total zero sequence impedance ZL0 (Ohms) 636. The total magnitude values ZT 634 and total zero sequence impedance ZL0 636 are input directly to fault type detection logic circuit of FIG. 11C. While the PGFA algorithm model 600 is shown for a single phase, e.g., Phase A, it is understood that the same model 600 is run for each of the remaining phases, e.g., phases B, C. From the experimental model 600, the test mode settings, shown in FIG. 11A, were selected to run the tests as grid simulation mode or signature library mode of FIG. 3, the fault type detection scope, shown in FIG. 11B, supervised the tests, and the fault type detection logic circuit, shown in FIG. 11C, identified the types of electrical faults.

In FIG. 10, for line Phase A simulation, the signal inputs 620 to the phase to ground fault apparent impedance algorithm block 650 include the measured phase currents ($I_A$, $I_B$, $I_C$) and phase to ground voltage ($V_A$), e.g., measured at the relay location in FIG. 5. At least the measured phase current value of $I_A$, $I_B$, $I_C$ are input to summation block 645 to generate a vector sum $I_A+I_B+I_C$ and the vector sum is input to block 647 to generate a corresponding frequency domain vector (magnitude and phase) representation. The vector multiplication block 648 further multiplies the magnitude of input compensation factor $K_0$ 630 by the vector sum magnitude representation of $I_A+I_B+I_C$. Block 652 further receives the corresponding angle value 632 of the compensation factor $K_0$ and adds it with the magnitude of the sum of the phase angles of $I_A+I_B+I_C$ from the output of the frequency domain conversion block 647. Further, multiplication blocks 654 generates a further representation of the phase angle output of block 652 in Radians, and this value is coupled with the output product of vector magnitude multiplication block 648 to generate a complex number representation at block 656.

Similarly, block 646 further receives the measured phase current value of $I_A$ to generate a corresponding frequency domain vector (magnitude and phase) representation and block 649 receives the measured phase voltage value of $V_A$ to generate a corresponding frequency domain vector (magnitude and phase) representation. The generated corresponding frequency domain vector (magnitude and phase) representation of measured phase current value of $I_A$ is further input to multiplication block 664 to generate a further representation of the phase angle output of block 646 in Radians and this value is coupled with the $I_A$ magnitude vector representation output of block 646 to generate a complex number representation at block 666. Summation block 670 receives the complex number outputs of blocks 656, 666 to generate a sum of the vectors given by:

"$I_A$" and "$K_0\, (I_A+I_B+I_C)$". Further, in the PGFA method 600 modeled in FIG. 10, block 675 performs a division, where the magnitudes of "$V_A$" is divided by the sum "$I_A+K_0\,(I_A+I_B+I_C)$".

Further, the algorithm model 600 for the PGFA impedance includes a switch 680 responsive to receiving the trip signal 424 output from the inverse time overcurrent relay model 415 shown in FIG. 6, and the Test mode input signal 640 from the Test Mode settings 700 shown in FIG. 11A, for enabling the grid simulation or the signature library modes for testing, to generate a gating signal 682 that enables control of a transmission gate 685 to output the phase to ground fault apparent (PGFA) impedance magnitude 690 for phase A in ohms, i.e., $$Z_{ag\_mag} = \frac{V_a}{I_a + K_0\,(3I_0)} = \frac{V_a}{I_a + K_0(I_b + I_b + I_c)}.$$

The circuit model 600 of FIG. 10 is similarly configured to further produce as output the phase to ground fault apparent impedance magnitude 690 for phases B (i.e., $Z_{bg\_}$_mag) and C (i.e., $Z_{cg\_}$mag). In an embodiment, the trip signal will keep the impedance values after the relay trip (post-fault state) with the simulation mode.

Figure 11C:
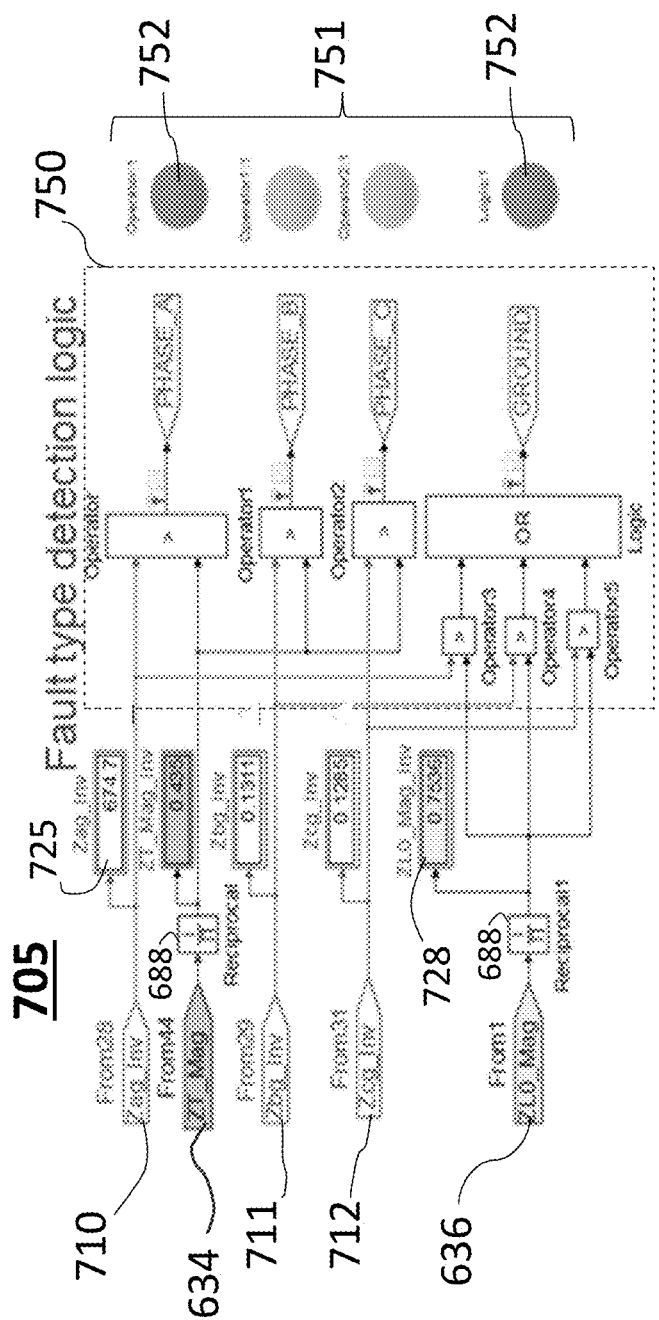
FIG. 11C depicts a circuit model embodying a fault type detection logic circuit for determining faulted and non-faulted power line circuit states based on measured PGFA admittance values in an embodiment.

FIGS. 11A-11C are depicting measured PGFA admittance and impedance magnitudes for each of exemplary fault states in a simulation of the utility power grid circuit of FIG. 5. In the grid simulation mode, the test mode setting 640 was 0 to start each test, shown in test mode setting circuit 700 of FIG. 11A, which was run for up to 3 s. Before running the grid simulation tests, the sequence impedances shown in FIG. 11A were set to feed the PGFA impedance algorithm block 650 shown in FIG. 10 and fault type detection logic circuit 705 shown in FIG. 11C. The respective PGFA admittance values 710, 711, 712 generated for respective phases A, B, C were calculated at a respective 1/π block 688 at the fault type detection scope circuit 702 shown in FIG. 11B. That is, as shown in FIGS. 11B and 11C, the computed $Z_{ag}$_mag 690, $Z_{bg}$_mag 691 and $Z_{cg}$_mag 692 phase to ground fault apparent impedance magnitudes for phases A, B, C obtained from model 600 of FIG. 10 can be viewed in a fault type detection scope 695 of FIG. 11B. In the example simulation, the fault block 409 of FIG. 5, was set with a type of electrical fault (LG, LL, LLG, 3L or 3LG), and placed near the breaker—or at the end of the power line sections labeled "28" or "38" in the power grid circuit shown in FIG. 5—and the fault block was tripped at 0.5 s.

In the signature library mode, the test mode setting was 1 to start each test, as shown in FIG. 11A, and read the signature library events in the MATLAB workspace. Furthermore, the signature library tests were run by downloading a signature library event in the MATLAB workspace. This signature library includes multiple real data sets, phase currents and voltages collected from the optical power line sensors deployed on the field, at a 46 kV EPB of an electrical substation. Once the simulation was running, the phase currents and voltages were measured, and the PGFA admittances were calculated and observed in a scope 695 shown in FIG. 11B. For the signature library and grid simulation tests, the scope 695 shown in FIG. 11B were used to supervise the simulations. After running the signature library and grid simulation tests, the output signals were saved in the MATLAB workspace to plot and analyze the data collected. In the grid simulation tests, the over-current relay trip signal 424 shown in FIG. 6 at the fault state kept the measured PGFA admittance magnitudes and angles after the fault state. Then, the relays kept the states of LEDs for the type of electrical fault during the post-fault states to observe the nature of faults. However, in the signature library tests, the over-current relay 415 did not trip because the tests were based on reading the currents and voltages from the stored events.

With respect to the fault type detection logic circuit 705 shown in FIG. 11C, this circuit 705 receives respective measured PGFA admittance values 710, 711, 712 generated for respective phases A, B, C at fault type detection scope 702 of FIG. 11B of circuit 600. Circuit 705 further receives total impedance boundary 634 and zero sequence impedance boundary 636 from FIG. 10, and each is processed by a respective 1/π block 688 to generate a respective total admittance boundary 725 and total zero sequence admittance boundary 728. The measured PGFA admittance values 710, 711, 712 and total admittance boundary value 725 and total zero sequence admittance boundary value 728 are input to a fault detection logic circuit 750 which includes circuitry implementing logic of both phase fault condition steps 40 of FIG. 1 to determine faulted or non-faulted phase states, and ground fault condition steps 50 of FIG. 1 to determine faulted or non-faulted ground condition states. The fault detection logic circuit 705 of FIG. 11C will trigger lighting of a series of light emitting diodes LED 751 to detect the types of electrical faults (i.e., LG, LL, LLG, 3L or 3LG). FIG. 11C depicts a detection of an LG fault where L=phase A as indicated by activated LEDs 752.

Fault States

The measured PGFA admittance magnitudes for the fault states of the grid simulation mode 202 and signature library events 201 of FIG. 3 were computed to assess the types of electrical faults. FIGS. 12A-12C are tables depicting measured PGFA admittance and impedance magnitudes for each of fault states in an exemplary simulation of the utility power grid circuit of FIG. 5. The test events were grouped into the types of electrical faults and their locations. For example, the measured PGFA impedance and admittance magnitudes shown in the table of FIG. 12A are computed based on fault 409A located at the breaker 411 of FIG. 5; the measured PGFA impedance and admittance magnitudes shown in the table of FIG. 12B are computed based on fault 409B located after the power line section labeled "28" of FIG. 5, and the measured PGFA impedance and admittance magnitudes shown in the table of FIG. 12C are computed based on fault 409C located after the power line section labeled "38" of FIG. 5.

Figure 13:
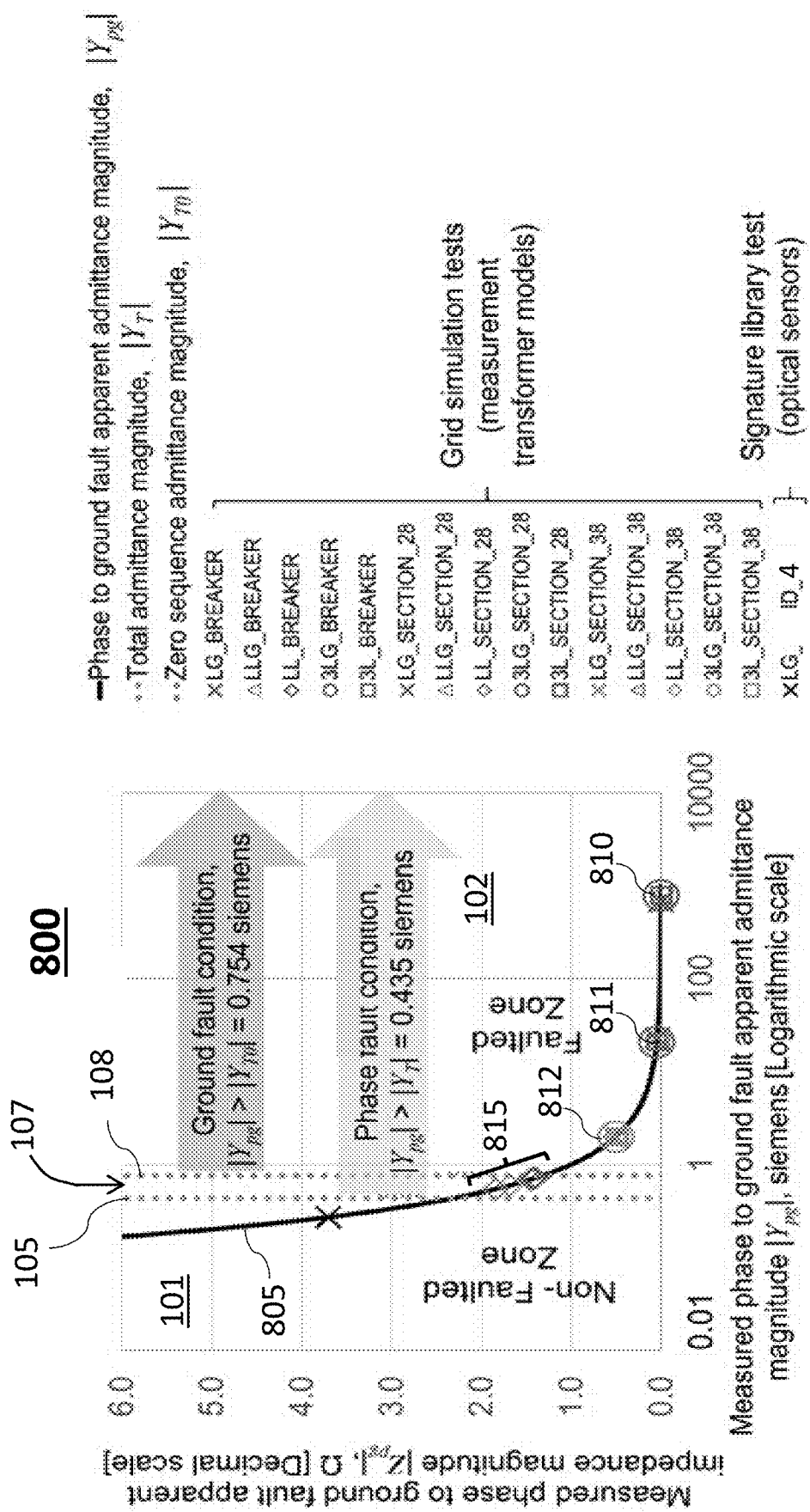
FIG. 13 shows a plot of each of the measured PGFA admittance and impedance magnitudes for the A, B, C phases at the respective fault states shown in FIGS. 12A-12C.

FIG. 13 shows a plot 800 of each of the measured PGFA admittance and impedance magnitudes for the A, B, C phases at the respective fault states shown in FIGS. 12A-12C. As in FIG. 2, FIG. 13 shows the measured PGFA impedance and admittance magnitudes represented in the vertical (decimal scale) and horizontal (logarithmic scale) axes, respectively. The curve 805 shows an expected path of the measured PGFA admittance magnitudes. The phase boundary ($|Y_T|$) is shown as vertical line 105 and the ground boundary ($|Y_{T0}|$) is shown as vertical line 108, based on the $|Y_T|$ and $|Y_{T0}|$ numerical values based on the table 550 of FIG. 9. For the grid simulation tests using MATLAB/Simulink saturated transformer models, the LG, LLG, 3LG and 3L electrical faults 810 near the breaker, the same electrical fault types 811 at the end of the power line section labeled "28" and the same electrical fault types 812 at the end of the power line section labeled "38" were set at the faulted zone 102 in FIG. 13. The measured PGFA admittance magnitudes for the LG, LLG, 3LG and 3L electrical faults were greater than 0.754 siemens. However, the measured PGFA admittance magnitudes for the LL electrical faults 815 were set in the faulted zone 107 between 0.754 and 0.435 siemens. Therefore, the LLG and LL electrical faults were distinguished satisfactorily because both types of electrical faults generated different measured PGFA admittance magnitudes. However, it is observed that the 3LG and 3L electrical faults generated similar measured PGFA admittance magnitudes.

Confusion Matrix and Results

The PGFA method with phase/ground boundaries was evaluated with a confusion matrix. In the matrix, the matching between the predicted, e.g., expected, and measured, e.g., observed, values for all tests were compared. Model inputs and outputs were defined in the PGFA admittance model shown in FIG. 14.

Figure 14:
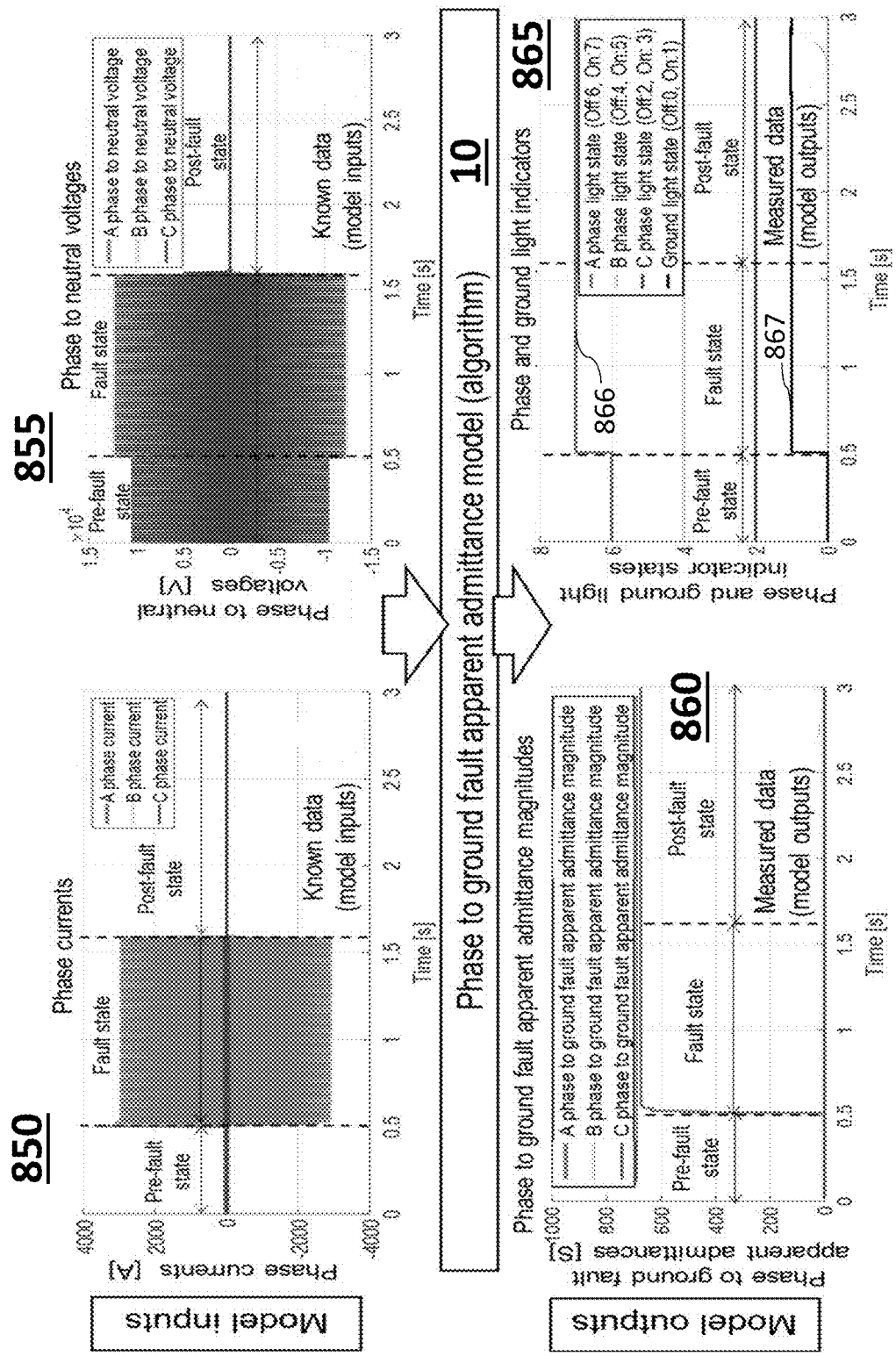
FIG. 14 depicts an example implementation of the PGFA admittance model showing example inputs and example outputs including the resulting generation of phase and ground light indicators.

In FIG. 14, the model inputs were the expected values, e.g., known data, stated by the A,B,C phase currents shown as a function of time in the plot 850, FIG. 14 and phase to neutral voltages shown as a function of time in the plot 855 of FIG. 14 at the non-faulted, e.g., pre-fault state (t≤0.5 s), and faulted, e.g., fault state (t≥0.5 s), situations. The PGFA admittance method 10 (FIG. 1) was run and the model outputs were the observed values, e.g., measured data, stated by the PGFA admittance magnitudes for A, B, C phases shown at plot 860 in FIG. 14, and the A, B, C phase/ground LEDs shown at plot 865 in FIG. 14 at the non-faulted, e.g., pre-fault state, and faulted, e.g., fault state, situations. The light indicator LED for phase A 866 and Ground light state 867 are shown triggered On in response to the fault state situation at t≥0.5 s.

Figures 15, 16:
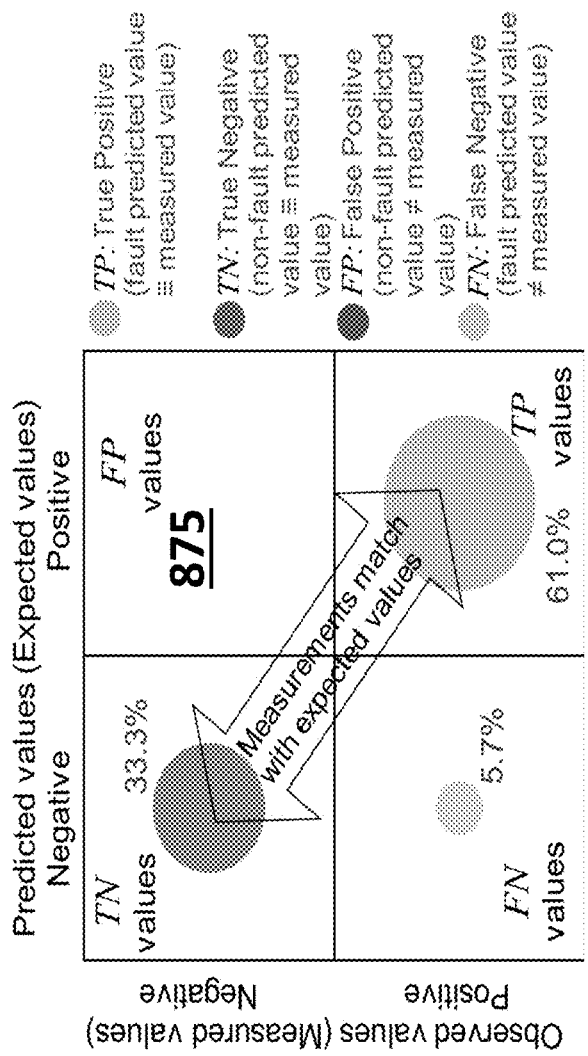
FIG. 15 depicts an illustrative confusion matrix for the PGFA admittance method based on the example implementation of FIG. 14.
FIG. 16 depicts a table illustrating the example computed values for Accuracy, precision, sensitivity, specificity, and error rate for the example implementation of FIG. 14.

Although not shown, there were obtained a plurality of values including: the predicted values and about 105 measured true positive (TP), false positive (FP), true negative (TN) and false negative (FN) values from the tests. The TP and FN values were considered when the fault-predicted values matched and did not match the measured values, respectively. The TN and FP values were considered when the non-fault-predicted values matched and did not match the measured values, respectively. As shown in FIG. 15, the confusion matrix 875 for the PGFA admittance method was created based on using the 105 measured values obtained from the tests. The measured TP, FP, TN, and FN values were 64, 0, 35 and 6, respectively. The measured TP, FP, TN, and FN values in percent were calculated for the 105 sets, and the results are shown in matrix 875 in FIG. 15.

The results from the confusion matrix (TP, FP, TN, FN values) were used to calculate the class statistics values such as the accuracy (Accuracy %), precision (Precision %), sensitivity (Sensitivity %), specificity (Specificity %) and error rate (Error rate %) to quantify the model performance. The Accuracy % is the degree of closeness to the true value, and it is calculated by Eq. (16).

$$\text{Accuracy}_\% = \left[\frac{TP + TN}{(TP + FP + TN + FN)}\right] \times 100. \quad (16)$$

The Precision % is the degree to which a process will repeat the same value, such as when a positive event is predicted and how often it is correct; it is calculated by Eq. (17).

$$\text{Precision}_\% = \left[\frac{TP}{FP + TP}\right] \times 100. \quad (17)$$

The Sensitivity % measures the true positive rate, when it is a positive event, and how often it is predicted as positive; it is given by Eq. (18).

$$\text{Sensitivity}_\% = \left[\frac{TP}{TP + FN}\right] \times 100. \quad (18)$$

The Specificity % measures the true negative rate, when it is a negative event, and how often it is predicted as negative; it can be computed by Eq. (19).

$$\text{Specificity}_\% = \left[\frac{TN}{TN + FP}\right] \times 100. \quad (19)$$

The Error rate % measures how often the measured values are wrong, and it is calculated by Eq. (20).

$$\text{Error rate}_\% = 100 - \text{Accuracy}_\% = \left[1 - \frac{TP + TN}{(TP + FP + TN + FN)}\right] \times 100. \quad (20)$$

FIG. 16 depicts a table 880 depicting the class statistics values of the PGFA admittance model, based on calculating the Accuracy %, Precision %, Sensitivity %, Specificity % and Error rate % with the measured TP, FP, TN, and FN values from the test results of the example PGFA model implementation of FIG. 14. In table 880, the Accuracy % of the PGFA admittance method was 94.3% having not distinguished between the 3L and 3LG electrical faults. The Precision % of the PGFA admittance method was 100% because when the predicted values were faulted, the measured values were faulted, and when the predicted values were non-faulted, the measured values were non-faulted. The Sensitivity % was 91.4% because the post-fault and fault states for the 3L electrical faults of the simulated grid events were FN values instead of TP values. The Specificity % was 100% because the non-fault and pre-fault states for all test events were always TN values, and the Error rate % was 5.7%.

Figure 17:
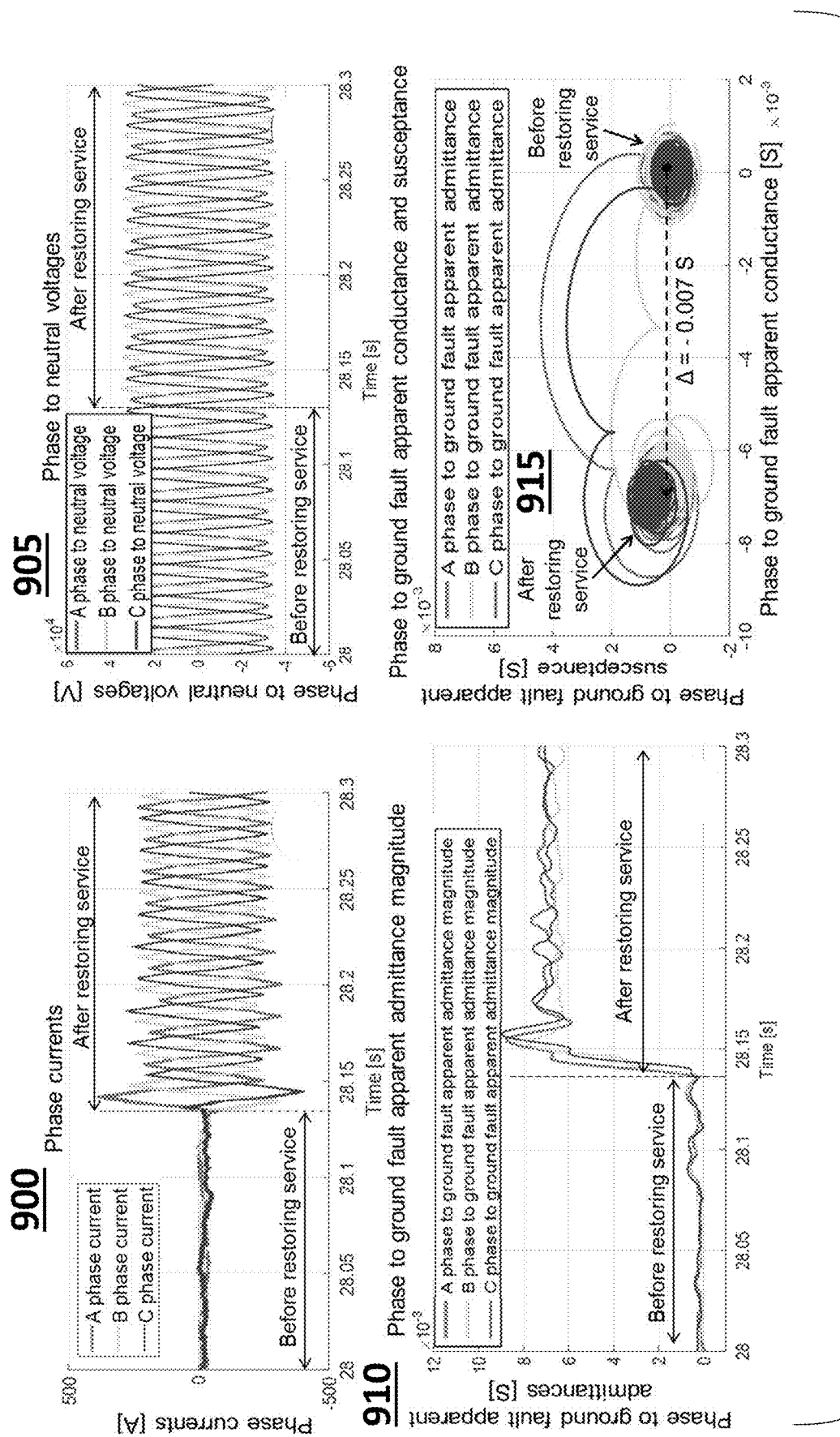
FIG. 17 depicts for an illustrative ID-1 signature event the corresponding plots of currents, voltages, PGFA admittance magnitudes, and PGFA conductance/susceptance from the optical power line sensors deployed on the field.
Figure 18:
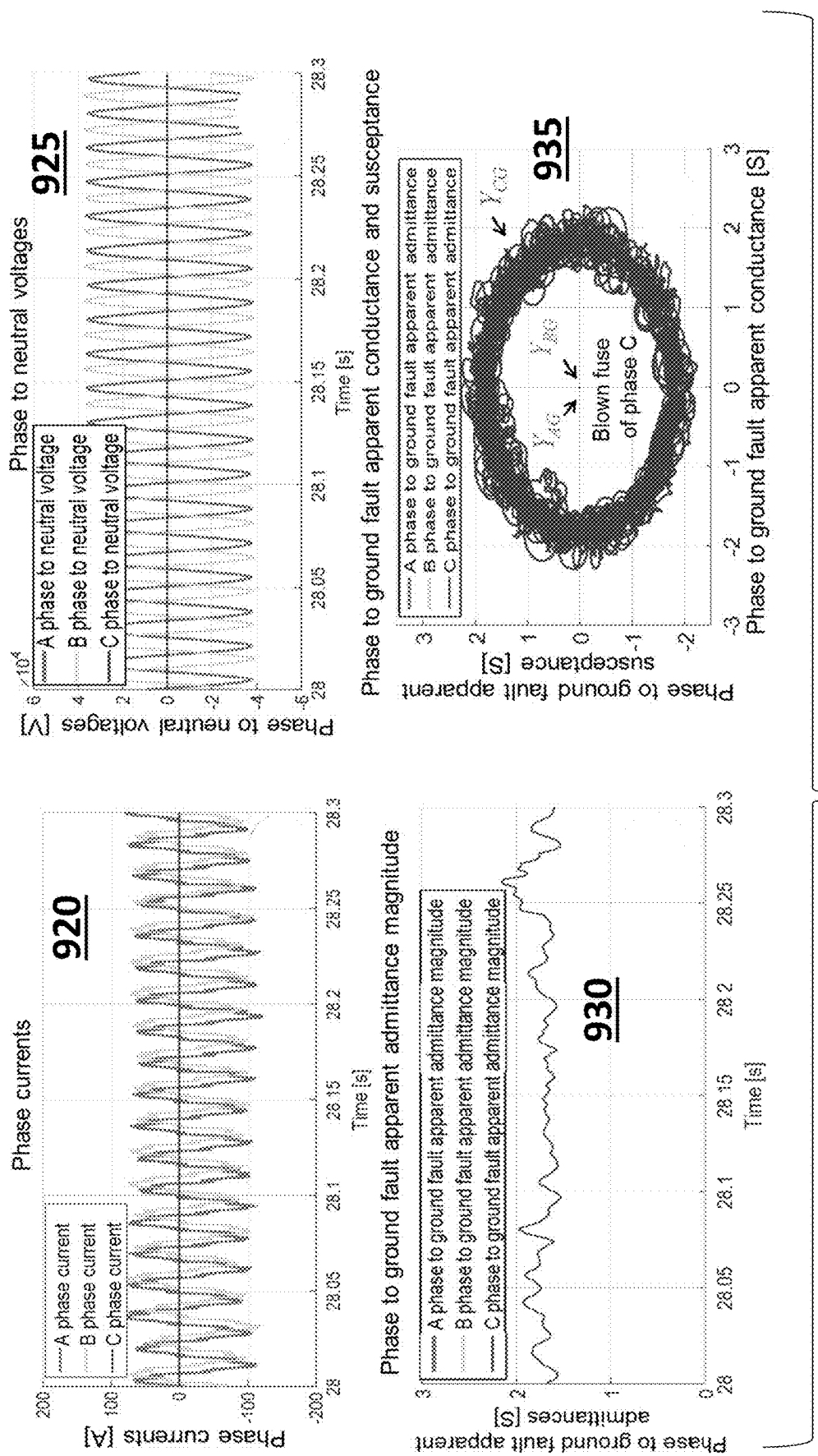
FIG. 18 depicts for the illustrative ID-2 signature fault event the corresponding plots of currents, phase to neutral voltages, PGFA admittance magnitudes, and PGFA conductance/susceptance from the optical power line sensors deployed on the field.
Figure 19:
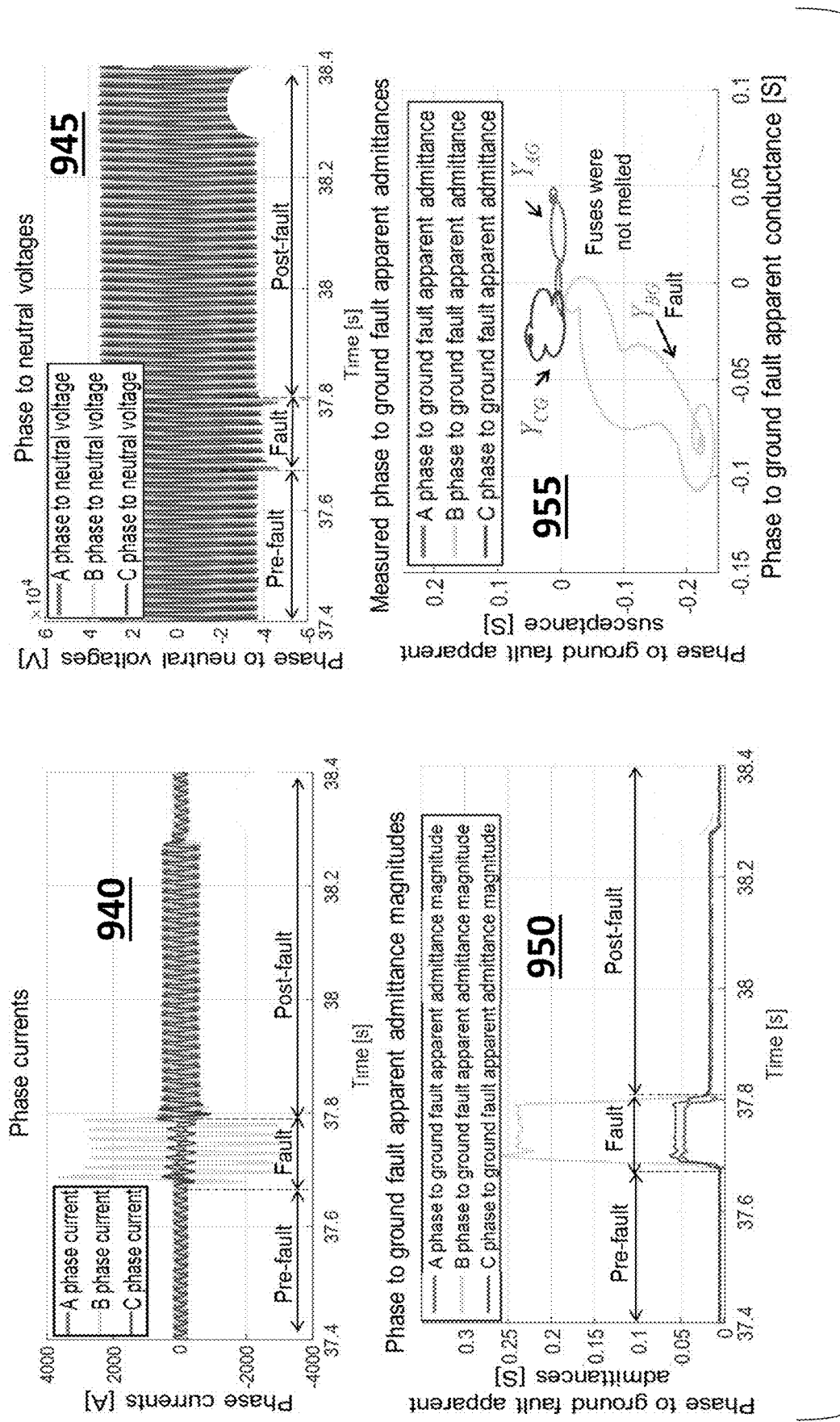
FIG. 19 depicts for the illustrative ID-4 signature fault event the corresponding plots of currents, phase to neutral voltages, PGFA admittance magnitudes, and PGFA conductance/susceptance from the optical power line sensors deployed on the field.

In the signature library mode, the COMTRADE events were converted into MATLAB files. The measured phase currents and voltages (26.6 kV phase to ground voltage) from the optical power line sensors deployed on the field, at the 46 kV EPB of the electrical substation were represented by the events shown in Table 1. The ID-1, ID-2 and ID-4 events were plotted as shown in FIGS. 17-19.

The signature ID-1 event was a service restoring of the A, B, and C phase feeders (non-fault state). FIG. 17 depicts for the illustrative ID-1 signature fault event the corresponding plot 900 of currents, plot 905 of voltages, plot 910 of PGFA admittance magnitudes, and plot 915 of PGFA conductance/susceptance from the optical power line sensors deployed on the field. When the service was restored, the phase currents increased considerably over time, at t≥28.15 s, as shown in the plot 900 in FIG. 17, and the voltages were like the pre-restoring service state shown in the plot 905 in FIG. 17. However, the PGFA admittance magnitudes increased from 0 to 0.009 siemens, at t≥28.15 s, as shown in the plot 910 of FIG. 17. Consequently, the dynamic paths of the PGFA admittances for each of the phases A, B, C before and after restoring the service were practically at the same location, moving from a conductance of 0 to −0.007 siemens, as shown in the plot 915 of FIG. 17. The signature ID-1 event was a non-fault situation because the PGFA admittance magnitudes for the states before and after restoring the service, as shown in the plot 910, were too small to detect the types of electrical faults.

The signature ID-2 fault event was a phase C to ground electrical fault that blew a fuse, e.g., post-fault state. FIG. 18 depicts for the illustrative ID-2 signature fault event the corresponding plot 920 of currents, plot 925 of phase to neutral voltages, plot 930 of PGFA admittance magnitudes, and plot 935 of PGFA conductance/susceptance from the optical power line sensors deployed on the field. This signature event shows the post-fault state when the phase C fuse was melted, and the measured current shown in the plot 920 of FIG. 18, and voltage shown in the plot 925 of FIG. 18 of the phase C were near zero. However, the measured PGFA admittance magnitude of the phase C was greater than zero, as shown in plot 930 of FIG. 18, observing the detection of phase C to ground electrical fault at the post-fault state. Consequently, the dynamic path of the PGFA admittance for the phase C was represented by a circle with a radius of approximately 2 siemens, and the PGFA admittances of phase A and B were practically zero, as shown in the plot 935 of FIG. 18.

The signature ID-4 fault event was a phase B to ground electrical fault. FIG. 19 depicts for the illustrative ID-4 signature fault event the corresponding plot 940 of currents, plot 945 of phase to neutral voltages, plot 950 of PGFA admittance magnitudes, and plot 955 of PGFA conductance/susceptance from the optical power line sensors deployed on the field. The signature ID-4 event was stated by the pre-fault, fault, and post-fault states. At the fault state, the measured phase B current increased, as shown in the plot 940 of FIG. 19, and the phase B to ground voltage decreased, as shown in the plot 945 of FIG. 19. This event could be a temporary phase B to ground electrical fault. The measured PGFA admittance magnitude of the phase B increased more than the other phases, as shown in the plot 950 of FIG. 19. Consequently, the dynamic path of the PGFA admittance for the phase B was greater than for the phase A and C, as shown in the plot 955 of FIG. 19.

Figure 20:
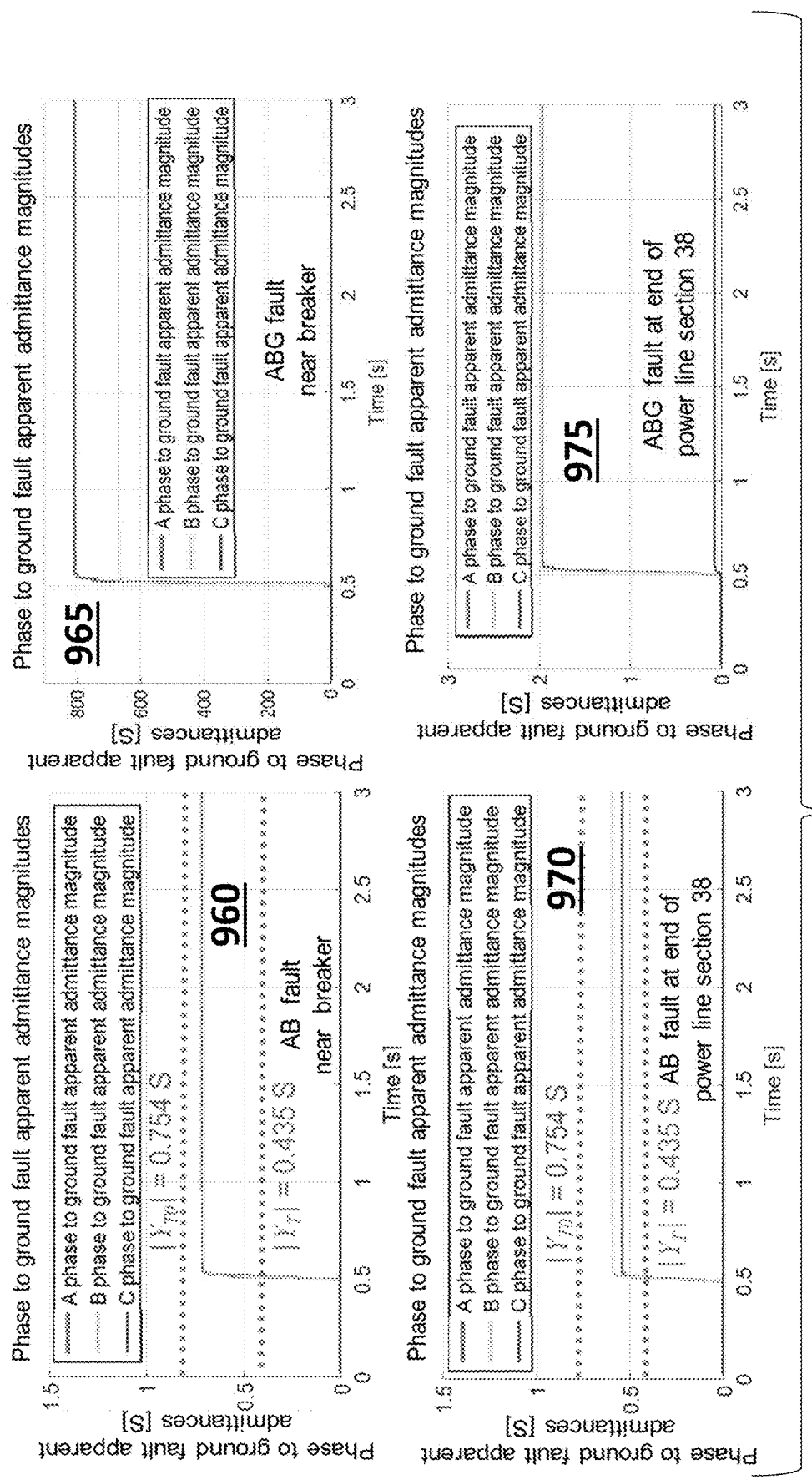
FIG. 20 shows respective plots depicting the measured PGFA admittance magnitudes for the example AB and ABG electrical faults near the breaker and at the end of the power line section labeled "38" in the example power grid circuit model of FIG. 5 with the CT/VT saturated models.

In the simulation grid mode, the currents and voltages from the saturated measurement transformer models were simulated at the 12.47 kV EPB of a utility grid, as shown in FIG. 5. FIG. 20 shows respective plots depicting the measured PGFA admittance magnitudes for the AB and ABG electrical faults near the breaker and at the end of the power line section labeled "38" with the CT/VT saturated models. The dynamic responses of the measured PGFA admittance magnitudes at the AB electrical faults near the breaker are shown in the plot 960 of FIG. 20 and at the end of the power line section labeled "38" as shown in the plot 970 of FIG. 20 were detected as non-grounding faults because the faulted phases were between 0.435 siemens ($|Y_T|$) and 0.754 siemens ($|Y_{T0}|$). However, the dynamic responses of the measured PGFA admittance magnitudes at the ABG electrical faults near the breaker shown in plot 965 of FIG. 20 and at the end of power line section labeled "38" in the plot 975 shown in FIG. 20 were detected as grounding faults because the faulted phases were greater than 0.754 siemens ($|Y_{T0}|$).

Figure 21:
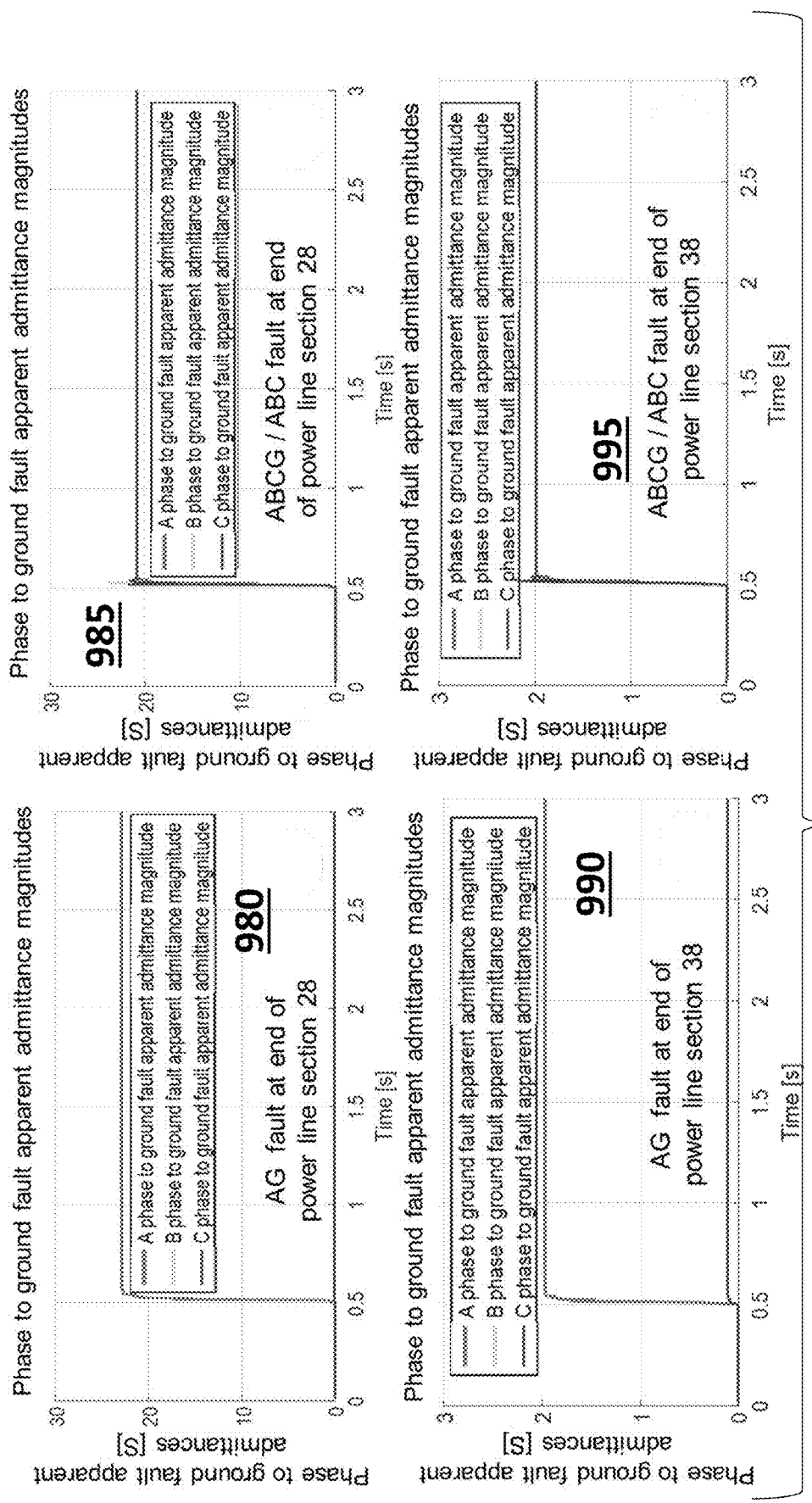
FIG. 21 shows respective plots depicting the measured PGFA admittance magnitudes for the example AG and ABCG/ABC electrical faults at the end of power the line section labeled "28" and "38" in the power grid circuit model of FIG. 5 with the CT/VT saturated models.

FIG. 21 shows respective plots depicting the measured PGFA admittance magnitudes for the AG and ABCG/ABC electrical faults at the end of power the line section labeled "28" and "38" in the power grid circuit modeled in FIG. 5 with the CT/VT saturated models. The dynamic responses of the measured PGFA admittance magnitudes at the AG and ABCG electrical faults at the end of the power line section labeled "28" shown in the plots 980, 985 in FIG. 21, and AG and ABCG electrical faults at the end of the power line section labeled "38" shown in the plots 990, 995 in FIG. 21 were detected satisfactorily as grounding electrical faults because the faulted phases were greater than 0.754 siemens ($|Y_{T0}|$). However, the dynamic response of the measured PGFA admittance magnitudes at the ABCG and ABC electrical faults were similar, without distinguishing between these electrical faults.

The examination of the PGFA admittance method with phase/ground boundaries was performed by using the signature library events and grid simulations. In the simulated grid events, the test results were collected from the saturated measurement transformers connected to a radial power system that was connected to a three-phase voltage source connected in Wye to an internally grounded neutral, e.g., 7.2 kV phase to neutral voltage, at a 12.47 kV EPB of a utility grid, as shown in FIG. 5. However, in the signature library events, the test results were collected from the optical power line sensors, e.g., 26.6 kV phase to neutral voltage, deployed on the field, at the 46 kV EPB of an electrical substation with delta-wye power transformers, e.g., insulated neutral point, that do not allow to pass the zero sequence. However, the phase B to ground electrical fault event (signature ID-4) from the optical power line sensors shown in the plots of FIG. 19 had shown a good behavior by measuring the highest admittance magnitudes at the faulted phase.

Herein, the PGFA admittance method with phase/ground boundaries could not differentiate between the 3LG and 3L electrical faults, however it could differentiate between the LG, LL and LLG electrical faults. However, the sequence method that detects the types of electrical faults by measuring the angle between the negative and zero sequence currents, the AG/BCG, CG/ABG, and BG/CAG electrical faults had the same detection conditions. Therefore, the PGFA admittance method with phase/ground boundaries could perform better than the sequence method, considering the LG/LLG electrical faults are more frequent than the 3LG/3L electrical faults in power grids.

Herein, a PGFA admittance method with phase/ground boundaries was described that is based on measuring the A, B and C phase admittance magnitudes for the faulted and non-faulted phases, resulting in greater than zero and near zero, respectively, and uses the phase/ground boundaries to distinguish between the LL and LLG electrical faults. The PGFA admittance method with phase/ground boundaries is based on the computation of the pre-setting algorithm values by using the zero, positive and negative sequences of power line sections, to determine phase and ground boundaries.

In the PGFA admittance method with phase/ground boundaries the protective relays are set at a specific location along the power line. However, this method could be executed at different protective relay locations along the power line once the pre-setting conditions are stated. Based on the data collection step shown in FIG. 1, the PGFA admittance method has a relay pre-setting condition that can be calculated by using the total zero ($Z_{T0}$), positive ($Z_{T1}$), negative ($Z_{T2}$) sequence impedance of the power line sections at the protective relay location. In addition, the PGFA admittance method defines the phase ($|Y_T|$) and ground ($|Y_{T0}|$) boundaries from Eq. (7) and Eq. (8) respectively, that depends on the total resistance ($R_T$), total reactance ($X_T$), total zero sequence resistance ($R_{T0}$) and total zero sequence reactance ($X_{T0}$) of power line sections at the protective relay location. Therefore, the PGFA admittance method with phase/ground boundaries could be performed at different protective relay locations along the power line once the relay pre-setting conditions were calculated.

Further, in the PGFA admittance method with phase/ground boundaries, faulted phases were detected for the LG, LL, LLG, 3LG and 3L electrical faults at different bus locations. In addition, the PGFA admittance algorithm was tested with grid simulations, e.g., MATLAB/Simulink saturated measurement transformer models, at a 12.47 kV EPB of a utility grid, and signature library events, e.g., optical power line sensor deployed on the field, from the 46 kV EPB of an electrical substation.

The PGFA admittance method with phase/ground boundaries had shown good behavior, resulting that the measured PGFA admittance magnitudes were greater than zero and near zero for the faulted and non-faulted phases, respectively. Whereas the AG/BCG, CG/ABG and BG/CAG electrical faults had the same detection conditions for the sequence method, the PGFA admittance method with phase/ground boundaries can differentiate between the LG and LLG electrical faults, once the PGFA admittance algorithm calculated pre-setting conditions to determine phase and ground boundaries.

The PGFA method with phase/ground boundaries was evaluated using a confusion matrix. The measured and predicted values (faulted and non-faulted phases) matched in more than 90% of the tests, and the PGFA admittance method with phase/ground boundaries presented an accuracy of 94.3% and a precision of 100%. The PGFA admittance method with phase/ground boundaries can be compared with protective relay's manufacturer methods with a real-time simulator and protective relays in the loop.

The disclosed PGFA admittance method can be used generally in fields such as detectors and sensors, or such as energy and utilities. More specifically, the PGFA admittance method and technology can be used in protective relays for identifying the type of faults with light indicators in a fast and more reliable/accurate way than the sequence method. In a non-limiting application, the PGFA admittance algorithm can be used in protective relays at transmission/distribution power lines and feeders.

Various aspects of the present disclosure may be embodied as a program, software, or computer instructions embodied or stored in a computer or machine usable or readable medium, or a group of media which causes the computer or machine to perform the steps of the method when executed on the computer, processor, and/or machine. A program storage device readable by a machine, e.g., a computer readable medium, tangibly embodying a program of instructions executable by the machine to perform various functionalities and methods described in the present disclosure is also provided, e.g., a computer program product.

The computer readable medium could be a computer readable storage device or a computer readable signal medium. A computer readable storage device may be, for example, a magnetic, optical, electronic, electromagnetic, infrared, or semiconductor system, apparatus, or device, or any suitable combination of the foregoing; however, the computer readable storage device is not limited to these examples except a computer readable storage device excludes computer readable signal medium. Additional examples of the computer readable storage device can include: a portable computer diskette, a hard disk, a magnetic storage device, a portable compact disc read-only memory (CD-ROM), a random access memory (RAM), a read-only memory (ROM), an erasable programmable read-only memory (EPROM or Flash memory), an optical storage device, or any appropriate combination of the foregoing; however, the computer readable storage device is also not limited to these examples. Any tangible medium that can contain, or store, a program for use by or in connection with an instruction execution system, apparatus, or device could be a computer readable storage device.

A computer readable signal medium may include a propagated data signal with computer readable program code embodied therein, such as, but not limited to, in baseband or as part of a carrier wave. A propagated signal may take any of a plurality of forms, including, but not limited to, electromagnetic, optical, or any suitable combination thereof. A computer readable signal medium may be any computer readable medium (exclusive of computer readable storage device) that can communicate, propagate, or transport a program for use by or in connection with a system, apparatus, or device. Program code embodied on a computer readable signal medium may be transmitted using any appropriate medium, including but not limited to wireless, wired, optical fiber cable, RF, etc., or any suitable combination of the foregoing.

The processor(s) described herein, e.g., a hardware processor, may be a central processing unit (CPU), a graphics processing unit (GPU), a field programmable gate array (FPGA), an application specific integrated circuit (ASIC), another suitable processing component or device, or one or more combinations thereof. The storage(s) may include random access memory (RAM), read-only memory (ROM) or another memory device, and may store data and/or processor instructions for implementing various functionalities associated with the methods and/or systems described herein.

The terminology used herein is for the purpose of describing particular aspects only and is not intended to be limiting the scope of the disclosure and is not intended to be exhaustive. Many modifications and variations will be apparent to those of ordinary skill in the art without departing from the scope and spirit of the disclosure.

What is claimed is:

1. A system for detecting types of electrical faults in a power line circuit of a power grid, said system comprising:
    a detector circuit for measuring multiphase voltage signals and multiphase current signals at a location of a power line circuit;
    a hardware processor associated with a memory storing program instructions in a computer system, the hardware processor running the program instructions configuring the processor to:
        obtain a total zero-sequence impedance value, a total positive-sequence impedance value and a total negative-sequence impedance value of a location of the power line circuit;
        compute a total zero-sequence admittance value as a function of said obtained total zero-sequence impedance value;
        compute a total admittance value as a function of said obtained total zero-sequence impedance value, the total positive-sequence impedance value and the total negative-sequence impedance value;
        for each phase of the multiphase voltage and current signals, obtain a corresponding phase ground fault admittance value at the location of a power line circuit;
        use fault type detection logic circuit to determine, based on obtained corresponding phase ground fault admittance values, an occurrence of an electrical fault and an electrical fault type at the power line circuit; and
        perform a corrective action at the power line circuit based on the determined electrical fault type.

2. The system as claimed in claim 1, wherein an electrical fault type comprises a phase fault condition, said fault type detection logic circuit comparing an obtained corresponding phase ground fault admittance value for each phase against said total admittance value, and determining a phase fault condition for a particular phase when the obtained corresponding phase ground fault admittance value exceeds said total admittance value.

3. The system as claimed in claim 2, wherein the power line circuit is part of a three phase power line grid having three power lines, wherein the determined phase fault condition comprises one of: a line-line (LL) fault or a three line (3L) fault.

4. The system as claimed in claim 3, wherein an electrical fault type comprises a ground fault condition, said fault type detection logic circuit comparing an obtained corresponding phase ground fault admittance value for each phase against said total zero-sequence admittance value, and determining a ground fault condition for a particular phase when the obtained corresponding phase ground fault admittance value exceeds said total zero-sequence admittance value.

5. The system as claimed in claim 4, wherein the determined ground fault condition comprises one of: a line-ground (LG) fault a double-line-ground (LLG) fault or a three-line-ground (3LG) fault.

6. The system as claimed in claim 5, wherein said detector circuit comprises:
    a current transformer associated with each line of said power line circuit for measuring individually, for each phase, a respective current; and
    a voltage transformer associated with each line of said power line circuit for measuring individually, for each phase, a respective voltage.

7. The system as claimed in claim 5, wherein said detector circuit comprises optical power line sensors located at the power line circuit for measuring individually, for each phase, a respective current and voltage.

8. The system as claimed in claim 5, wherein said power line circuit of said power grid comprises:
a protective line monitoring relay set at a specific location along the power line configured to use said fault detection logic circuit to determine an occurrence of an electrical fault and an electrical fault type at the power line circuit, said protective line monitoring relay pre-set with a phase fault condition boundary corresponding to said total admittance value and pre-set with a ground fault condition boundary corresponding to said total zero-sequence admittance value.

9. The system as claimed in claim 8, wherein said protective line-monitoring relay comprises a display indicating the type of fault condition for each of said LL, LG, LLG, 3LL or 3LG type electrical faults.

10. The system as claimed in claim 9, wherein said power line circuit of said power grid comprises a circuit breaker associated with said protective line monitoring relay, wherein to perform said corrective action at the power line circuit, said hardware processor operating the breaker based on the determined electrical fault type at said power line circuit.

11. A method for detecting types of electrical faults in a power line circuit of a power grid, the method comprising:
measuring, using a detector circuit, multiphase voltage signals and multiphase current signals at a location of a power line circuit;
obtaining, using a programmed hardware processor, a total zero-sequence impedance value, a total positive-sequence impedance value and a total negative-sequence impedance value of a location of the power line circuit;
computing, using the programmed hardware processor, a total zero-sequence admittance value as a function of said obtained total zero-sequence impedance value;
computing, using the programmed hardware processor, a total admittance value as a function of said obtained total zero-sequence impedance value, the total positive-sequence impedance value and the total negative-sequence impedance value;
for each phase of the multiphase voltage and current signals, obtaining, using the programmed hardware processor, a corresponding phase ground fault admittance value at the location of a power line circuit;
determining, using a fault type detection logic circuit, and based on obtained corresponding phase ground fault admittance values, an occurrence of an electrical fault and an electrical fault type at the power line circuit; and
performing, using the programmed hardware processor, a corrective action at the power line circuit based on the determine electrical fault type.

12. The method as claimed in claim 11, wherein an electrical fault type comprises a phase fault condition, said fault type detection logic circuit comparing an obtained corresponding phase ground fault admittance value for each phase against said total admittance value, and determining a phase fault condition for a particular phase when the obtained corresponding phase ground fault admittance value exceeds said total admittance value.

13. The method as claimed in claim 12, wherein the power line circuit is part of a three phase power line grid having three power lines, wherein the determined phase fault condition comprises one of: a line-line (LL) fault or a three line (3L) fault.

14. The method as claimed in claim 13, wherein an electrical fault type comprises a ground fault condition, said fault type detection logic circuit comparing an obtained corresponding phase ground fault admittance value for each phase against said total zero-sequence admittance value, and determining a ground fault condition for a particular phase when the obtained corresponding phase ground fault admittance value exceeds said total zero-sequence admittance value.

15. The method as claimed in claim 14, wherein the determined ground fault condition comprises one of: a line-ground (LG) fault a double-line-ground (LLG) fault or a three-line-ground (3LG) fault.

16. A system for protecting power transmission/distribution, the system comprising:
one or more detectors configured to measure current signals corresponding to each respective phase of multiphase current through a power line of a power grid circuit and voltage signals corresponding to each respective phase of multiphase voltage for at least a particular section of the powerline;
a breaker module configured to activate an electrical breaker at the particular section in response to receiving a fault notification indicative of (i) an occurrence of an electrical fault at the particular section and (ii) a type of the electrical fault; and
a monitoring circuit communicatively coupled with the one or more detectors and the breaker module, the monitoring circuit configured to:
pre-obtain one or more admittance magnitude boundaries for the powerline, one admittance magnitude boundary comprising a total admittance magnitude boundary value defining a phase fault zone indicating presence of an electrical phase fault condition;
determine, based on the measured current signals of said multiphase current and voltage signals from said multiphase voltage, a corresponding phase to ground fault apparent admittance magnitude value for each phase;
determine, for each phase, whether the corresponding determined phase to ground fault apparent admittance magnitude value for that phase is within the defined phase fault zone; and
responsive to determining a measured phase to ground fault apparent admittance value for a particular phase is within the defined phase fault zone, provide a phase fault notification to the breaker module of an electrical fault occurrence for that particular phase.

17. The system as claimed in claim 16, wherein a pre-obtained admittance magnitude boundary for the powerline comprises a total zero-sequence admittance magnitude boundary value defining a ground fault zone indicating presence of an electrical ground fault condition, the hardware process is further configured to:
determine, for each phase, whether a corresponding determined phase to ground fault apparent admittance value for that phase is within the defined ground fault zone; and
responsive to determining a measured phase to ground fault apparent admittance magnitude value for a particular phase is within the defined ground fault zone, provide a ground fault notification to the breaker module of an electrical fault occurrence for that particular phase.

18. The system as claimed in claim 17, wherein to determine, for each phase, whether a corresponding determined phase to ground fault apparent admittance value for that phase is within the defined phase fault zone, the monitoring circuit is further configured to:
   compare a magnitude of the phase to ground fault apparent admittance value for each phase against the total admittance magnitude boundary value; and
   determine, based on the comparison, whether an electrical phase fault condition has occurred at the particular location.

19. The system as claimed in claim 18, wherein to determine, for each phase, whether a corresponding determined phase to ground fault apparent admittance magnitude value for that phase is within the defined ground fault zone, the monitoring circuit is further configured to:
   compare a magnitude of the phase to ground fault apparent admittance value for each phase against the total zero-sequence admittance magnitude boundary value; and
   determine, based on the comparison, whether an electrical ground fault condition has occurred at the particular location.

20. The system of claim 19, wherein the communicatively coupled monitoring circuit is further configured to
   pre-obtain impedance data for the powerline comprising a total positive-sequence impedance, a total negative-sequence impedance, and a total zero-sequence impedance; and
   pre-determine, based on the pre-obtained impedance data, the admittance boundaries and a total zero-sequence compensation factor, and
   obtain the phase to ground fault apparent admittance magnitude value for each phase based also on the total zero-sequence compensation factor.

21. The system of claim 16, wherein the one or more detectors comprises:
   a current transformer at the power line for obtaining said current signals; and
   a voltage transformer at the power line for obtaining said voltage signals.

22. The system of claim 16, wherein said monitoring circuit comprises:
   a protective relay for detecting faulted and non-faulted phases, said protective relay comprising one or more a light indicators for indicating presence of an electrical ground fault condition, an electrical phase fault condition, or both, an electrical ground and phase fault conditions notification for the particular phase.

23. A method comprising
   presetting, at a protective relay associated with a power line section of a power grid circuit, one or more electrical fault condition boundary parameters;
   obtaining current signals and voltage signals corresponding to respective multiphase current and multiphase voltage carried at the power line section;
   obtaining, based on the current signals of multiphase current and the multiphase voltage signals from said multiphase voltage, a corresponding phase to ground fault apparent admittance magnitude value associated with each phase at the power line section;
   determining, for each phase, whether the corresponding determined phase to ground fault apparent admittance magnitude value exceeds one or more of said electrical fault condition boundary parameters; and
   responsive to determining a measured phase to ground fault apparent admittance value for a particular phase exceeds one or more of said electrical fault condition boundary parameters, providing a phase fault notification to a circuit breaker module associated with the protective relay at said power line section of an electrical fault occurrence and type of electrical fault for that particular phase at that power line section; and
   configuring the circuit breaker module at said power line section in accordance with said electrical fault type.

24. The method of claim 23, wherein one or more said electrical fault condition boundary parameters comprises a total admittance magnitude boundary parameter value.

25. The method of claim 23, wherein one or more said electrical fault condition boundary parameters comprises a total zero-sequence admittance magnitude boundary parameter value.

* * * * *